US011825196B2

(12) United States Patent
Wakashima et al.

(10) Patent No.: US 11,825,196 B2
(45) Date of Patent: Nov. 21, 2023

(54) IMAGE SENSOR AND IMAGE CAPTURING APPARATUS

(71) Applicant: CANON KABUSHIKI KAISHA, Tokyo (JP)

(72) Inventors: Shunichi Wakashima, Tokyo (JP); Kohei Okamoto, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/444,400

(22) Filed: Aug. 4, 2021

(65) Prior Publication Data
US 2022/0046178 A1  Feb. 10, 2022

(30) Foreign Application Priority Data

Aug. 7, 2020  (JP) .................................. 2020-135071
Jun. 9, 2021  (JP) .................................. 2021-096751
Jul. 19, 2021  (JP) .................................. 2021-119009

(51) Int. Cl.
*H01L 27/146* (2006.01)
*H04N 23/67* (2023.01)
*H04N 25/771* (2023.01)

(52) U.S. Cl.
CPC ..... *H04N 23/672* (2023.01); *H01L 27/14612* (2013.01); *H01L 27/14638* (2013.01); *H04N 25/771* (2023.01)

(58) Field of Classification Search
None
See application file for complete search history.

(56) References Cited

U.S. PATENT DOCUMENTS

2014/0320711 A1* 10/2014 Fukuda ............ H04N 5/232122
348/294
2015/0312485 A1* 10/2015 Kitani .............. H04N 5/232122
348/308
2017/0018584 A1* 1/2017 Ma ................... H01L 27/14643
(Continued)

FOREIGN PATENT DOCUMENTS

JP  2019-186925 A   10/2019
WO  2016/053519 A1   4/2016
WO  2019/035380 A1   2/2019

OTHER PUBLICATIONS

European Search Report dated Feb. 16, 2022, that issued in the corresponding European Patent Application No. 21189775.6.
(Continued)

*Primary Examiner* — Twyler L Haskins
*Assistant Examiner* — Wesley J Chiu
(74) *Attorney, Agent, or Firm* — Cowan, Liebowitz & Latman, P.C.

(57) ABSTRACT

An image sensor comprising a plurality of microlenses, and a pixel array having, with respect to each of the microlenses, a pair of first regions formed at a first depth from a surface on which light is incident, a pair of second regions formed at a second depth deeper than the first depth, and a plurality of connecting regions that connects the pair of first regions and the pair of second regions, respectively. A direction of arranging the pair of second regions corresponding to each microlens is a first direction, and a direction of arranging the pair of first regions is either the first direction or a second direction which is orthogonal to the first direction.

17 Claims, 29 Drawing Sheets

(56) References Cited

U.S. PATENT DOCUMENTS

| | | | | |
|---|---|---|---|---|
| 2017/0171470 A1* | 6/2017 | Sakioka | ................. | H04N 23/84 |
| 2018/0374886 A1* | 12/2018 | Iwata | ................ | H01L 27/14643 |
| 2019/0258025 A1 | 8/2019 | Ando | | |
| 2020/0035724 A1* | 1/2020 | Machida | ................. | H04N 9/07 |
| 2021/0151478 A1* | 5/2021 | Iwabuchi | ............ | H01L 27/1464 |
| 2021/0400203 A1* | 12/2021 | Saito | .................. | H01L 27/1461 |

OTHER PUBLICATIONS

Cited in the Jul. 8, 2022 Japanese Office Action, without an English Translation, that issued in Japanese Patent Application No. 2021-119009.

* cited by examiner

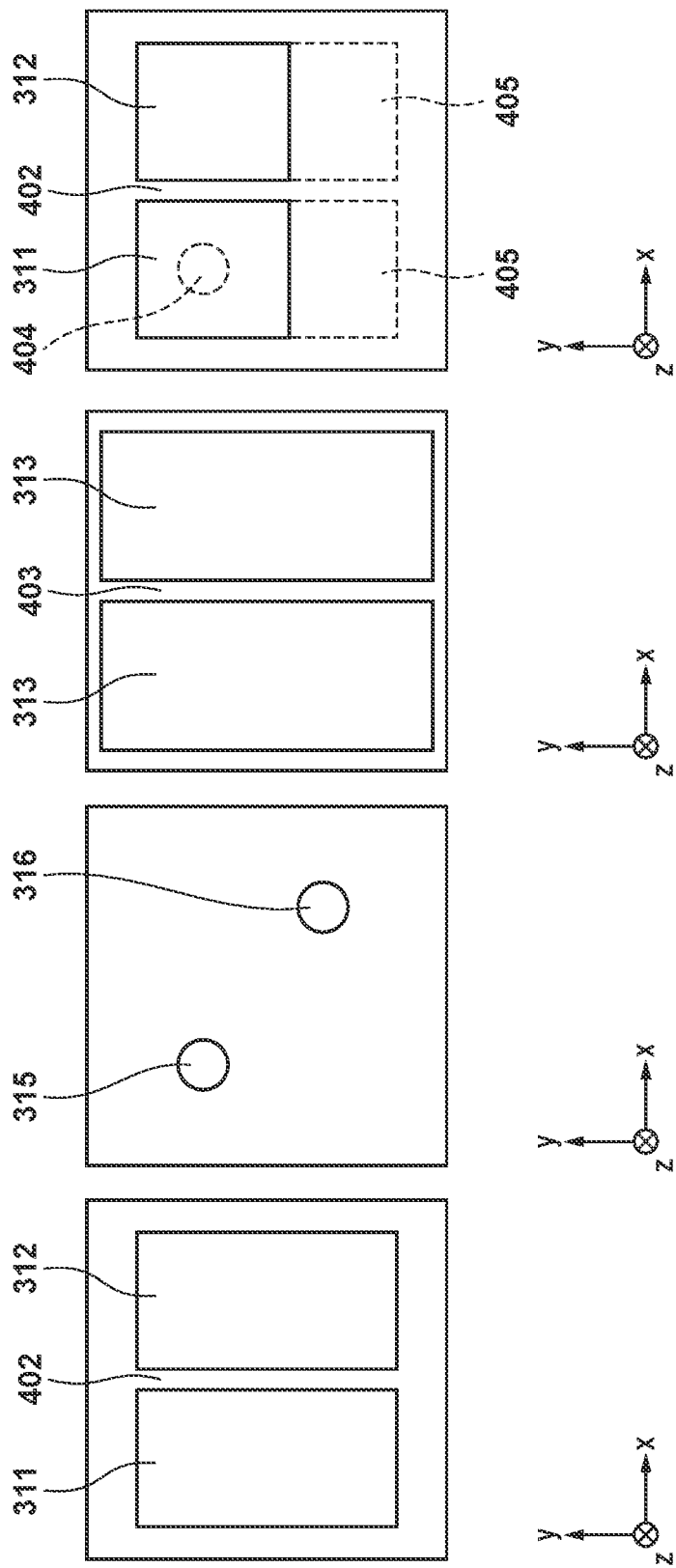

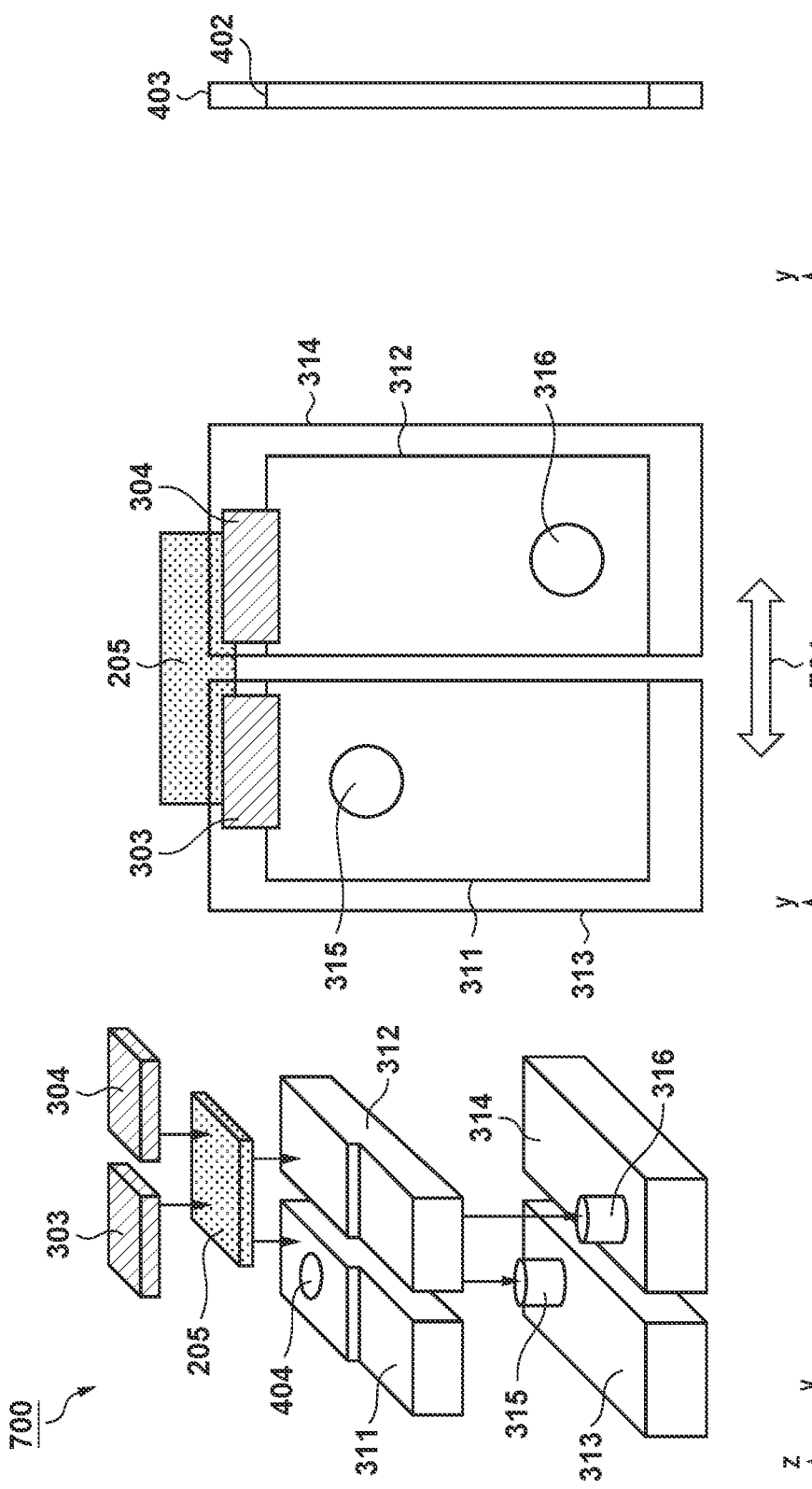

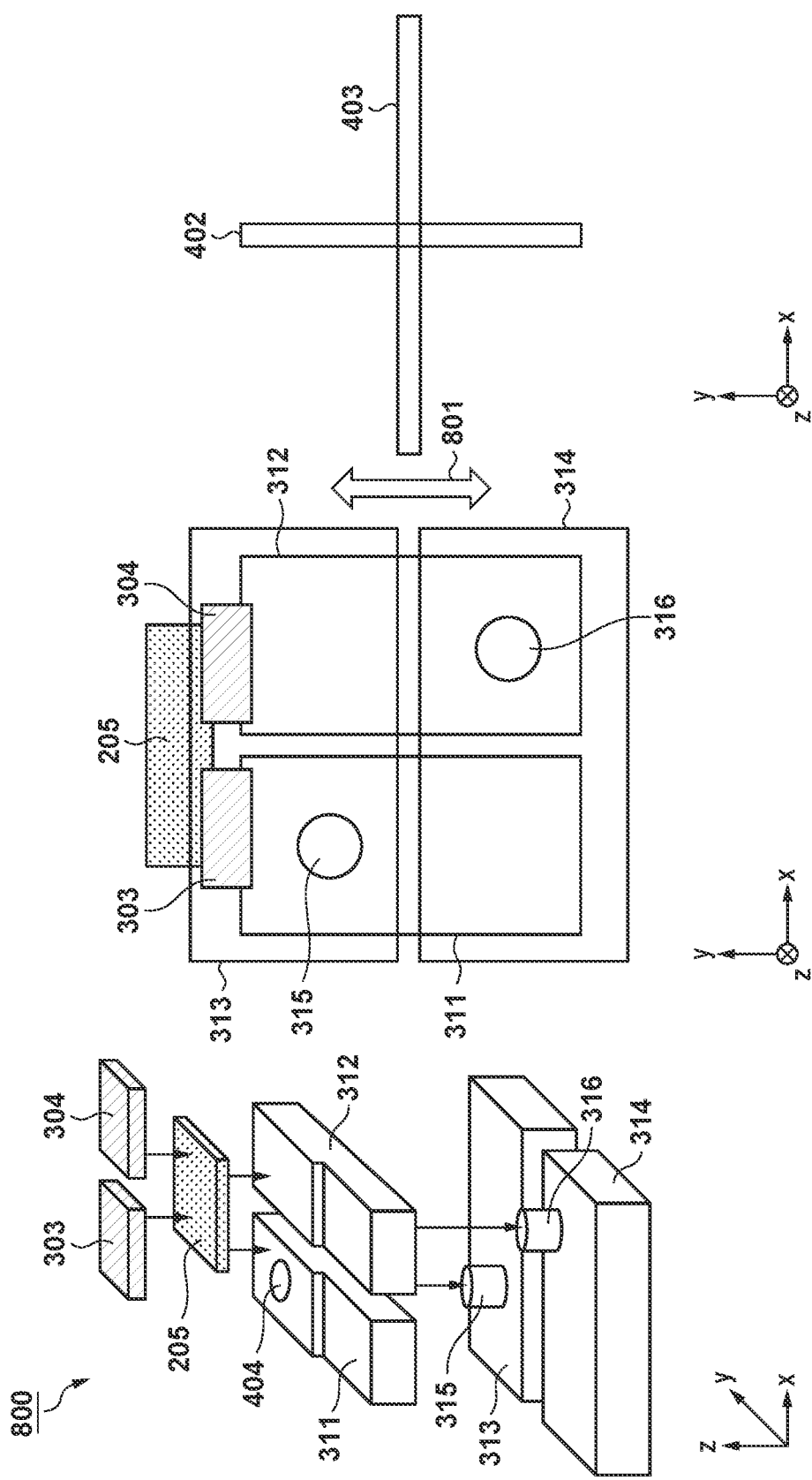

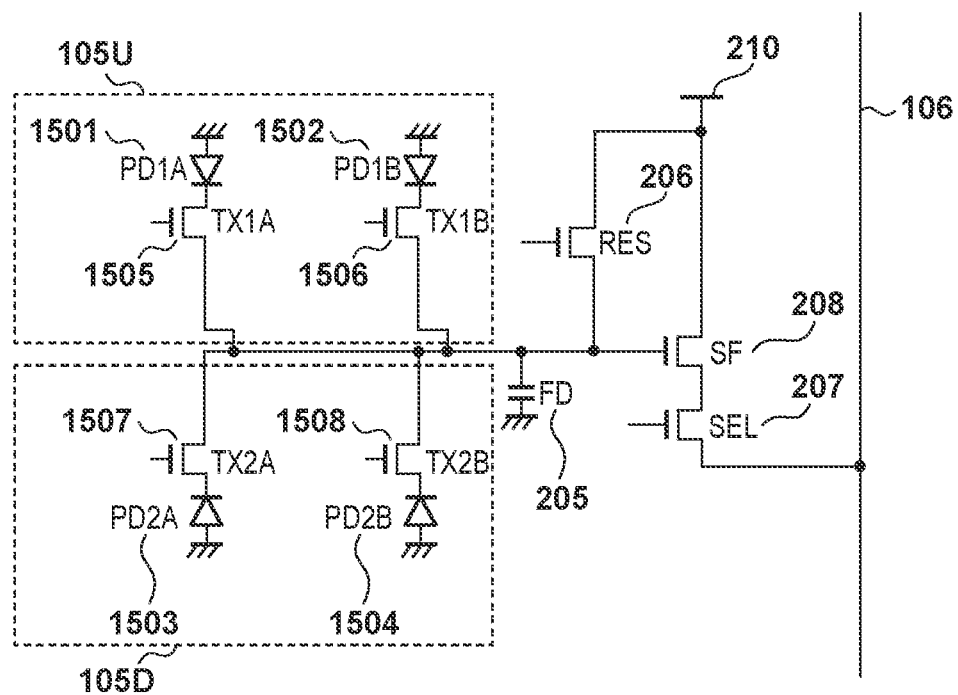
F I G. 15

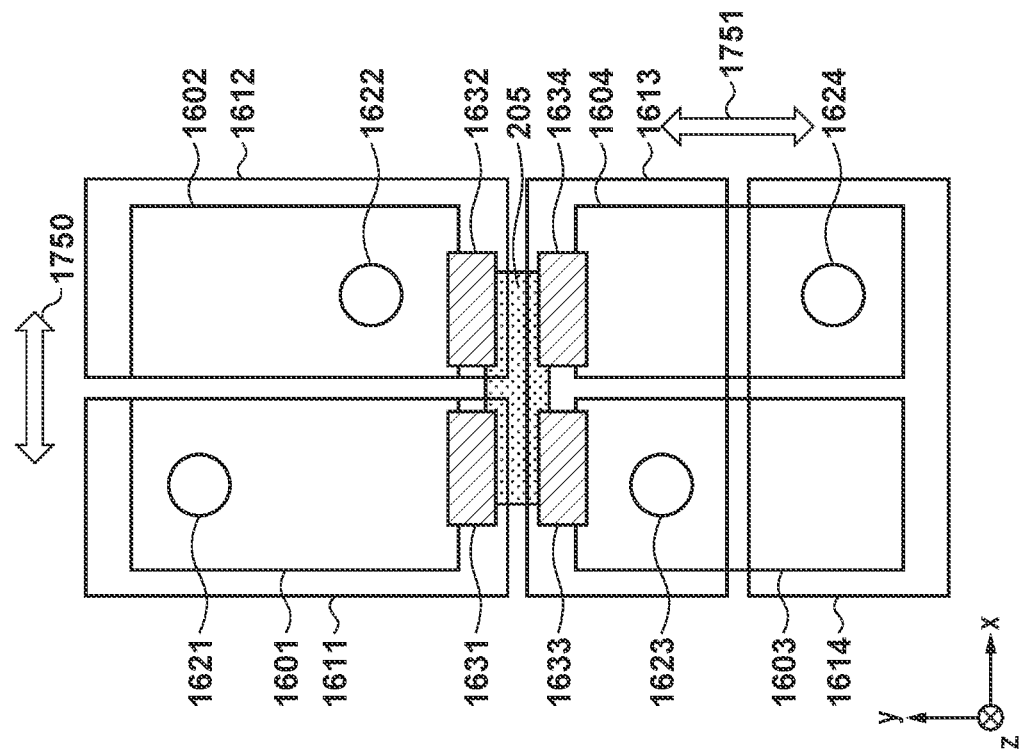
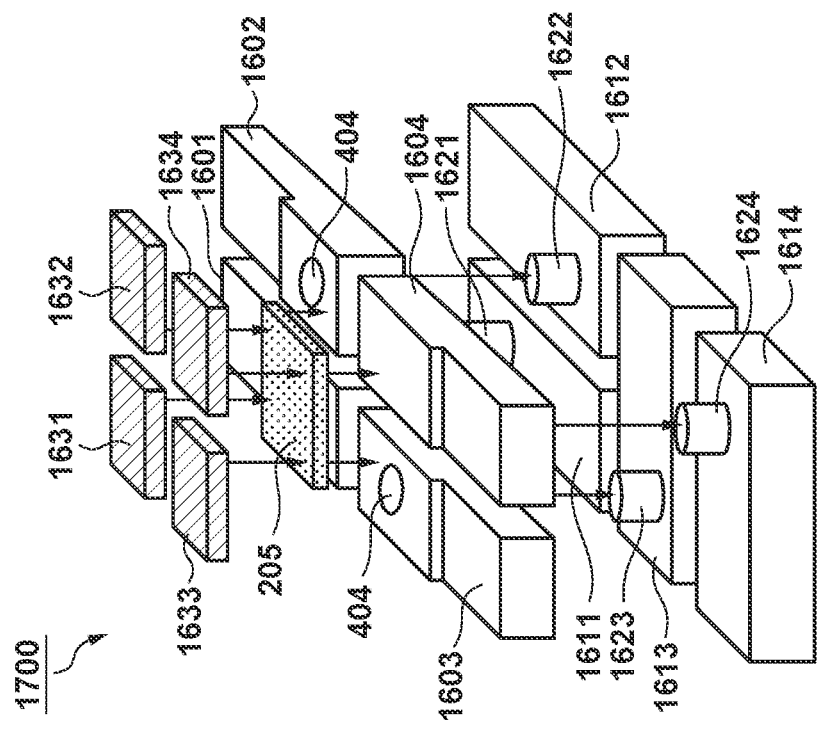

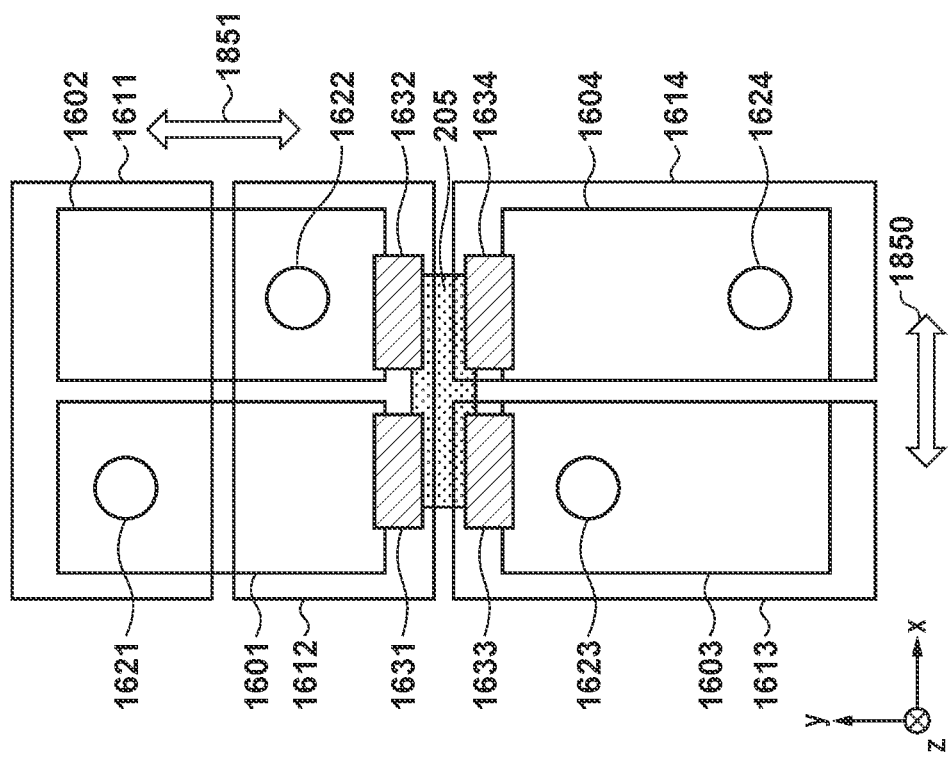
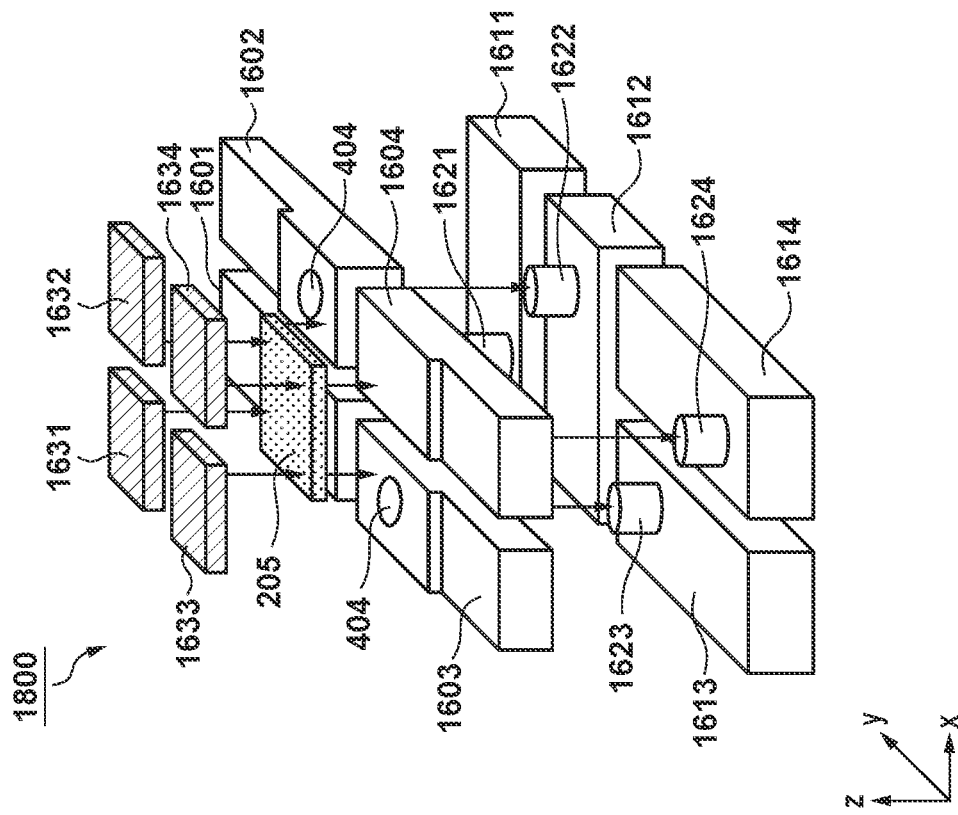

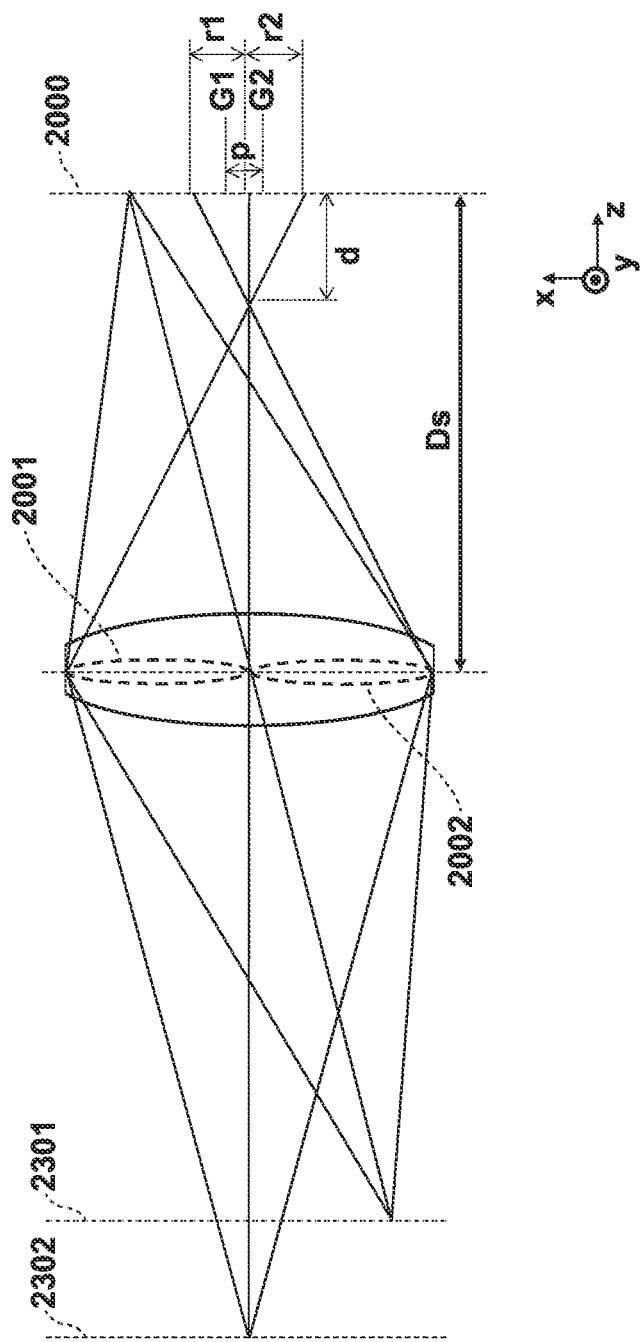

F I G. 27
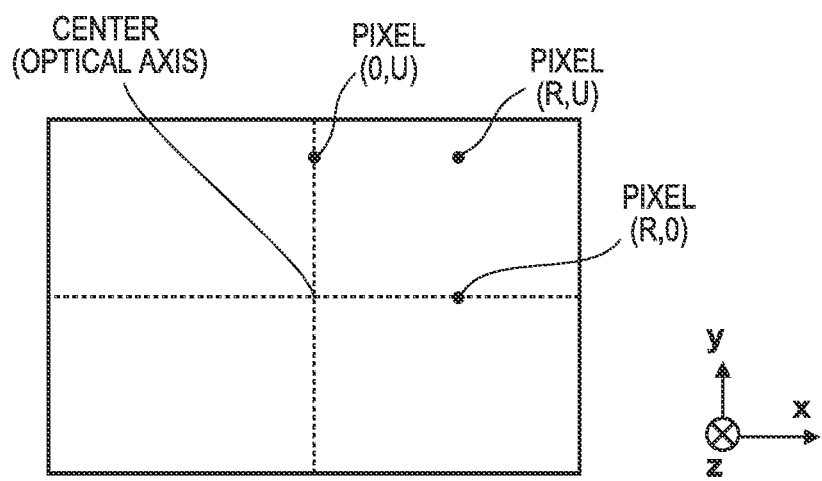

IMAGE SENSOR AND IMAGE CAPTURING APPARATUS

BACKGROUND OF THE INVENTION

Field of the Invention

The present invention relates to an image sensor in which a plurality of pixel units each having a plurality of photoelectric conversion units are two-dimensionally arranged, and an image capturing apparatus equipped with the image sensor.

Description of the Related Art

As one of the focus detection methods performed in an image capturing apparatus, a so-called on-imaging plane phase difference method in which a pair of pupil division signals are acquired using the focus detection pixels formed in an image sensor and focus detection of the phase difference method is performed using the pair of pupil division signals is known.

In such an image sensor, International Publication No. 2016/53519 discloses to suppress color mixing of a phase difference detection signal to an imaging signal by forming photoelectric conversion portions at different depths in order to photoelectrically convert visible light in different wavelength ranges. Further, it also discloses to obtain focus detection signals having phase differences in two different directions from one pixel by forming a pair of regions that mainly photoelectrically convert red light in a deep portion and a pair of regions that mainly photoelectrically convert blue light in a shallow portion, and arranging the pairs of regions in directions orthogonal to each other.

However, the image sensor disclosed in International Publication No. 2016/53519 uses a transfer transistor for transferring a signal from each of the photoelectric conversion portions formed at different depths, or a vertical transfer transistor that is commonly used for transferring signals from a plurality of the photoelectric conversion portions formed at different depths. When a transfer transistor is provided for each of the photoelectric conversion portions, the number of transfer transistors is large and the area of the light receiving region becomes small, in which case there is a problem that the manufacturing cost is high and the saturation charge amount that a photoelectric conversion portion can hold is small. Further, in a case where a vertical transfer transistor is used, there is a problem that the manufacturing cost of the image sensor will be increased because the process for forming the transistor is complicated.

SUMMARY OF THE INVENTION

The present invention has been made in consideration of the above situation, and increases a saturation charge amount with a simple configuration while keeping the number of the pupil division directions of the phase difference signals for focus detection at two.

According to the present invention, provided is an image sensor comprising: a plurality of microlenses; and a pixel array having, with respect to each of the microlenses, a pair of first regions formed at a first depth from a surface on which light is incident, a pair of second regions formed at a second depth deeper than the first depth, and a plurality of connecting regions that connects the pair of first regions and the pair of second regions, respectively, wherein a direction of arranging the pair of second regions corresponding to each microlens is a first direction, and a direction of arranging the pair of first regions is either the first direction or a second direction which is orthogonal to the first direction.

Further, according to the present invention, provided is an image capturing apparatus comprising: an image sensor comprising: a plurality of microlenses; and a pixel array having, with respect to each of the microlenses, a pair of first regions formed at a first depth from a surface on which light is incident, a pair of second regions formed at a second depth deeper than the first depth, and a plurality of connecting regions that connects the pair of first regions and the pair of second regions, respectively; and a focus detection unit that obtains pupil division signals respectively corresponding to divided pupil regions from signals output from the pixel array, and perform phase difference focus detection based on the pupil division signals, wherein a direction of arranging the pair of second regions corresponding to each microlens is a first direction, and a direction of arranging the pair of first regions is either the first direction or a second direction which is orthogonal to the first direction, and wherein the focus detection unit is implemented by one or more processors, circuitry or a combination thereof.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 5A to 5D are plan views of sensitivity regions of the pixel shown in FIGS. 4A to 4C at each depth in the z direction.

FIGS. 7A to 7C are schematic views showing a first arrangement of semiconductor regions in the first embodiment.

FIGS. 8A to 8C are schematic views showing a second arrangement of semiconductor regions in the first embodiment.

FIG. 15 is an equivalent circuit diagram of two pixels according to a second embodiment.

FIGS. 17A and 17B are schematic views showing a sixth arrangement of semiconductor regions in the second embodiment.

FIGS. 18A and 18B are schematic views showing a seventh arrangement of semiconductor regions in the second embodiment.

FIG. 24 is a diagram showing a schematic relationship between an image shift amount between parallax images and a defocus amount according to the third embodiment.

FIG. 27 is a diagram showing pixel positions according to the third embodiment.

DESCRIPTION OF THE EMBODIMENTS

Figure 1:
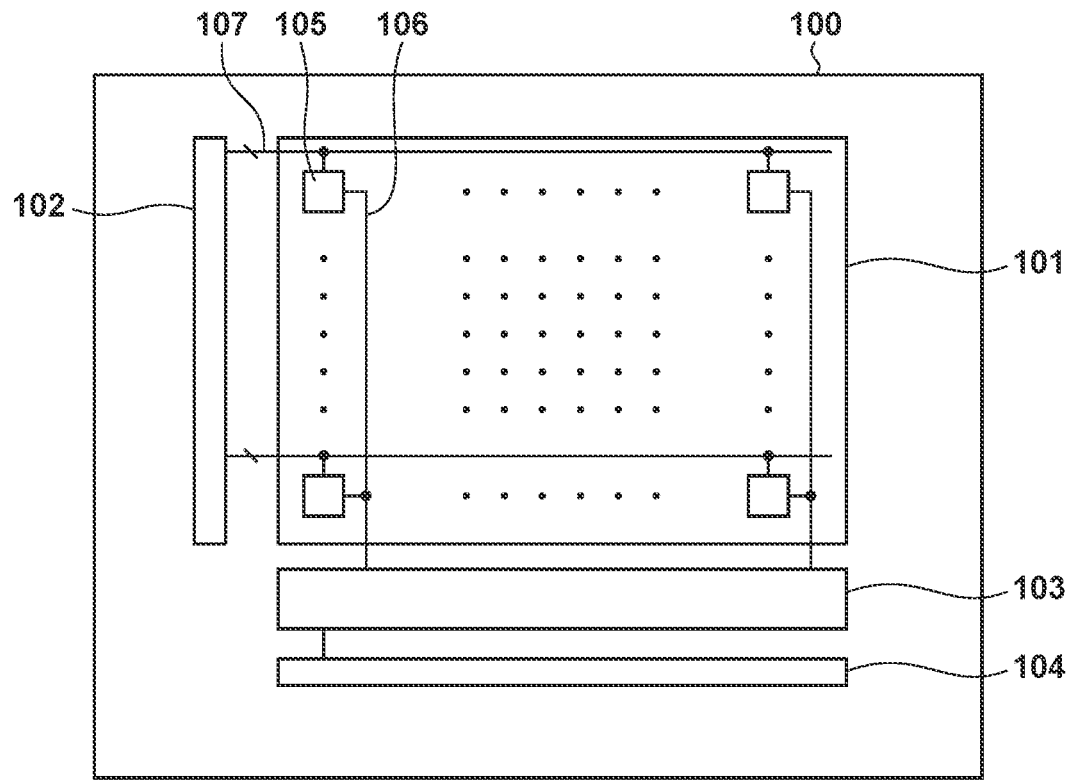
FIG. 1 is a diagram schematically showing an overall configuration of an image sensor according to an embodiment of the present invention.

Hereinafter, embodiments will be described in detail with reference to the attached drawings. Note, the following embodiments are not intended to limit the scope of the claimed invention, and limitation is not made an invention that requires a combination of all features described in the embodiments. Two or more of the multiple features described in the embodiments may be combined as appropriate. Furthermore, the same reference numerals are given to the same or similar configurations, and redundant description thereof is omitted.

First Embodiment

FIG. 1 is a diagram schematically showing the overall configuration of an image sensor 100 according to a first embodiment of the present invention. The image sensor 100 includes a pixel array 101 (pixel section), a vertical selection circuit 102, a column circuit 103, and a horizontal selection circuit 104.

A plurality of pixels 105 are arranged in a matrix in the pixel array 101. The outputs of the vertical selection circuit 102 are input to the pixels 105 via pixel drive wiring groups 107, and the pixel signals of the pixels 105 in a row selected by the vertical selection circuit 102 are read out to the column circuit 103 via output signal lines 106. One output signal line 106 may be provided for each pixel column or for a plurality of pixel columns, or a plurality of the output signal lines 106 may be provided for each pixel column. Signals read out in parallel through the plurality of output signal lines 106 are input to the column circuit 103, and the column circuit 103 performs processes, such as signal amplification, noise reduction, and A/D conversion, are performed, and holds the processed signals. The horizontal selection circuit 104 selects the signals held in the column circuit 103 sequentially, randomly, or simultaneously, so that the selected signals are output outside the image sensor 100 via a horizontal output line and an output section (not shown).

By sequentially performing the operation of outputting the pixel signals in the row selected by the vertical selection circuit 102 to the outside of the image sensor 100 while the vertical selection circuit 102 changes the row to select, two-dimensional imaging signals or focus detection signals can be read out from the image sensor 100.

Figure 2:
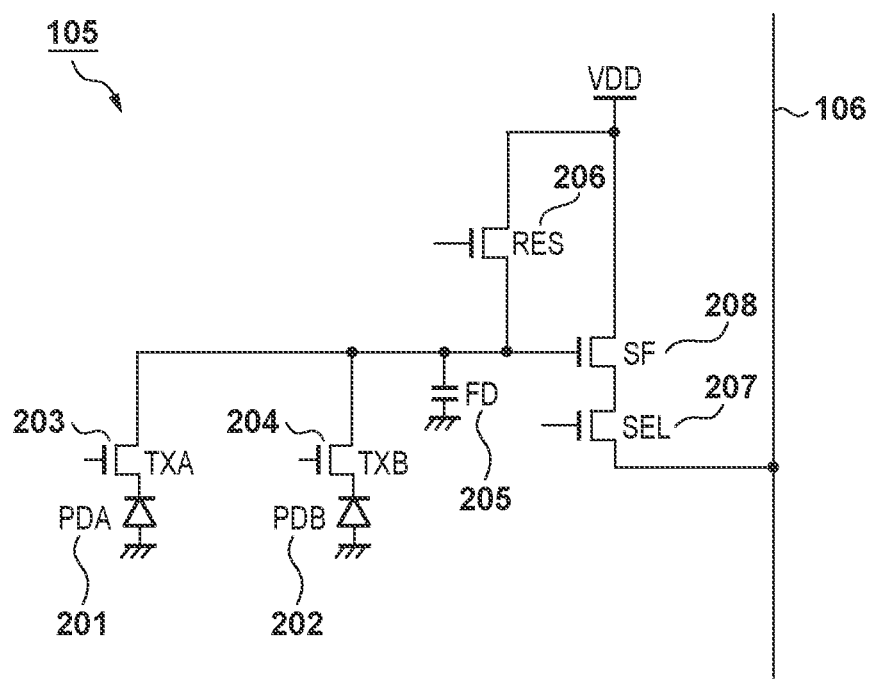
FIG. 2 is an equivalent circuit diagram of a pixel according to a first embodiment.

FIG. 2 is an equivalent circuit diagram of the pixel 105 of the present embodiment.

Each pixel 105 has two photodiodes 201 (PDA) and 202 (PDB), which are photoelectric conversion units. The signal charge which is photoelectrically converted by the PDA 201 corresponding to the amount of incident light and accumulated in the PDA 201 is transferred to a floating diffusion unit (FD) 205 that constitutes a charge storage unit via a transfer switch (TXA) 203. Further, the signal charge which is photoelectrically converted by the PDB 202 and accumulated in the PDB 202 is transferred to the FD 205 via a transfer switch (TXB) 204. A reset switch (RES) 206 is turned on to reset the FD 205 to the voltage of a constant voltage source VDD. Further, by turning on the RES 206, TXA 203 and TXB 204 simultaneously, it is possible to reset the PDA 201 and PDB 202.

When the selection switch (SEL) 207 for selecting a pixel is turned on, the amplification transistor (SF) 208 converts the signal charge accumulated in the FD 205 into a voltage, and the converted signal voltage is output from the pixel to the output signal line 106. Further, the gates of the TXA 203, TXB 204, RES 206, and SEL 207 are connected to the pixel drive wiring group 107, and are controlled by the vertical selection circuit 102.

In the following description, in the present embodiment, the signal charge accumulated in the photoelectric conversion unit is electrons, the photoelectric conversion unit is formed by an N-type semiconductor, and a P-type semiconductor is used to separate the N-type semiconductor. However, the signal charge may be holes, and the photoelectric conversion unit may be formed by a P-type semiconductor and an N-type semiconductor may be used to separate the P-type semiconductor.

Next, in the pixel having the above-described configuration, the operation of reading out the signal charge from the PDAs 201 and PDBs 202 after the predetermined charge accumulation period has elapsed since the PDAs 201 and PDBs 202 are reset will be described. First, when the SEL 207 of each of the pixels 105 in the row selected by the vertical selection circuit 102 is turned on and the source of the SF 208 and the output signal line 106 are connected, a voltage corresponding to the voltage of FD 205 can be read out to the output signal line 106. Then, the RES 206 is turned on and then off, thereby the potential of the FD 205 is reset. After that, the process waits until the output signal line 106 affected by the voltage fluctuation of the FD 205 settles down, and the column circuit 103 takes the voltage of the settled output signal line 106 as a signal voltage N, processes it, and holds the processed signal voltage N.

After that, the TXA 203 is turned on and then off, thereby the signal charge stored in the PDA 201 is transferred to the FD 205. The voltage of the FD 205 drops by the amount corresponding to the amount of signal charge stored in the PDA 201. After that, the process waits until the output signal line 106 affected by the voltage fluctuation of the FD 205 settles down, and the column circuit 103 takes the voltage of the settled output signal lines 106 as a signal voltage A, processes it, and holds the processed signal voltage A.

After that, the TXB 204 is turned on and then off, thereby the signal charge stored in the PDB 202 is transferred to the FD 205. The voltage of the FD 205 drops by the amount corresponding to the amount of signal charge stored in the PDB 202. After that, the process waits until the output signal line 106 affected by the voltage fluctuation of the FD 205 settles down, and the column circuit 103 takes the voltage of the settled output signal lines 106 as a signal voltage (A+B), processes it, and holds the processed signal voltage (A+B).

From the difference between the signal voltage N and the signal voltage A taken in this way, a signal A corresponding to the amount of signal charge stored in the PDA 201 can be obtained. Further, from the difference between the signal voltage A and the signal voltage (A+B), a signal B corresponding to the amount of signal charge accumulated in the PDB 202 can be obtained. This difference calculation may be performed by the column circuit 103 or after those signals are output from the image sensor 100. A phase difference signal can be obtained by using the signal A and the signal B, independently, and an imaging signal can be obtained by adding the signal A and the signal B. Alternatively, in a case where the difference calculation is performed after the signal voltages are output from the image sensor 100, the imaging signal may be obtained by taking the difference between the signal voltage N and the signal voltage (A+B).

Basic Structure of Pixels

Next, with reference to FIGS. 3 to 6, the basic structure of the pixel 105 in the present embodiment will be described in detail.

Figure 3:
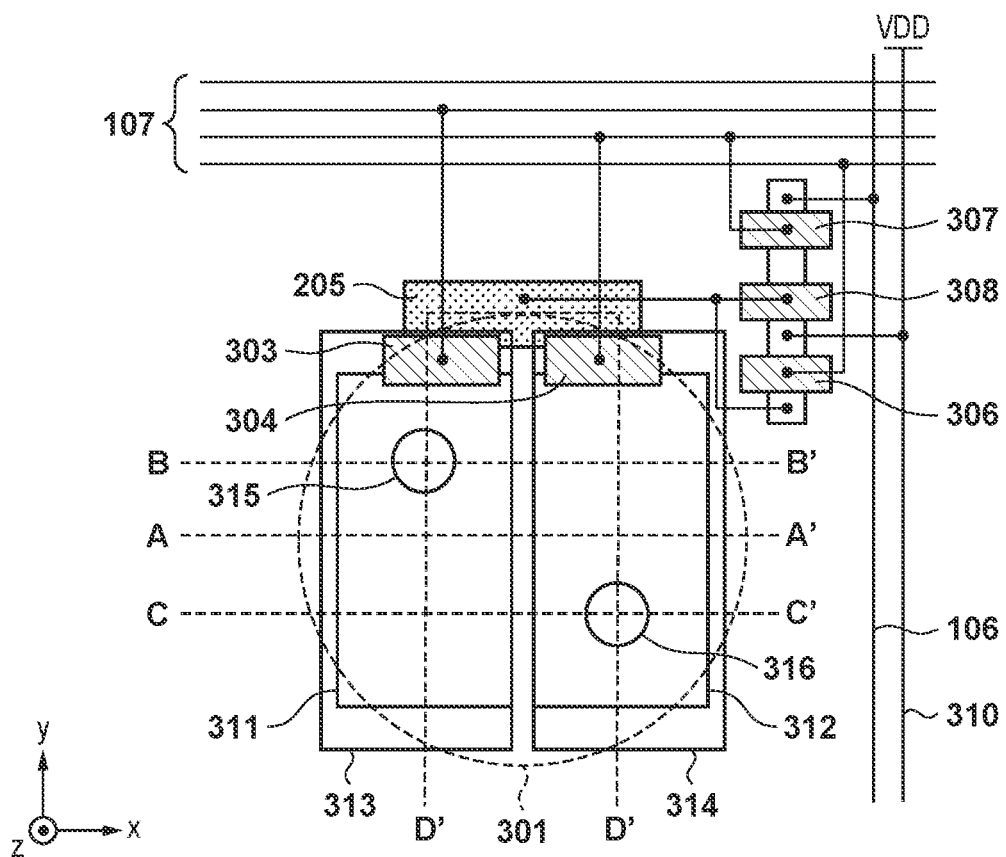
FIG. 3 is a schematic diagram showing a basic layout of elements constituting a pixel according to the first embodiment.

FIG. 3 is a schematic diagram showing a basic layout of the elements constituting the pixel 105 according to the present embodiment. In FIG. 3, the horizontal direction is the x direction, the vertical direction is the y direction, and the protruding direction is the z direction. Further, in the present embodiment, "plan view" means viewing from the z direction or the −z direction with respect to a plane (xy plane) substantially parallel to the surface of the semiconductor substrate on the side where the gates of the transistors are arranged. Further, in the present embodiment, the "horizontal" direction refers to the x direction, the "vertical" direction refers to the y direction, and the "depth" direction refers to the z direction.

In FIG. 3, the same configurations as those in FIGS. 1 and 2 are given the same reference numerals, and detailed description thereof will be omitted. In FIG. 3, 301 denotes a microlens (ML); 303, a gate electrode of the TXA 203; 304, a gate electrode of the TXB 204; 306, a gate electrode of the RES 206; 307, a gate electrode of the SEL 207; 308, a gate electrode of the SF 208; and 310, a voltage supply line.

The PDA 201 includes an accumulation region 311, a sensitivity region 313, and an N-type connecting region 315, and the PDB 202 includes an accumulation region 312, a sensitivity region 314, and an N-type connecting region 316. These accumulation regions 311 and 312, sensitivity regions 313 and 314, and N-type connecting regions 315 and 316 are made of N-type semiconductors. The sensitivity regions 313 and 314 have larger areas than the accumulation regions 311 and 312, respectively. Further, as will be described in detail with reference to FIGS. 4A to 4C, the accumulation regions 311 and 312 are formed at a first depth, and the sensitivity regions 313 and 314 are formed at a second depth different from the first depth. Further, for the sake of clarity, the region where the electric charge is mainly generated in response to the incident light is referred to as the "sensitivity region", and the region where the generated electric charge is mainly accumulated is referred to as the "accumulation region". However, there is no clear distinction between the charge generation region and the charge accumulation region. Charges are also generated in the accumulation regions 311 and 312 in response to the light that has arrived, and a part of the generated charges stays in the sensitivity regions 313 and 314 as well.

Figure 4A:
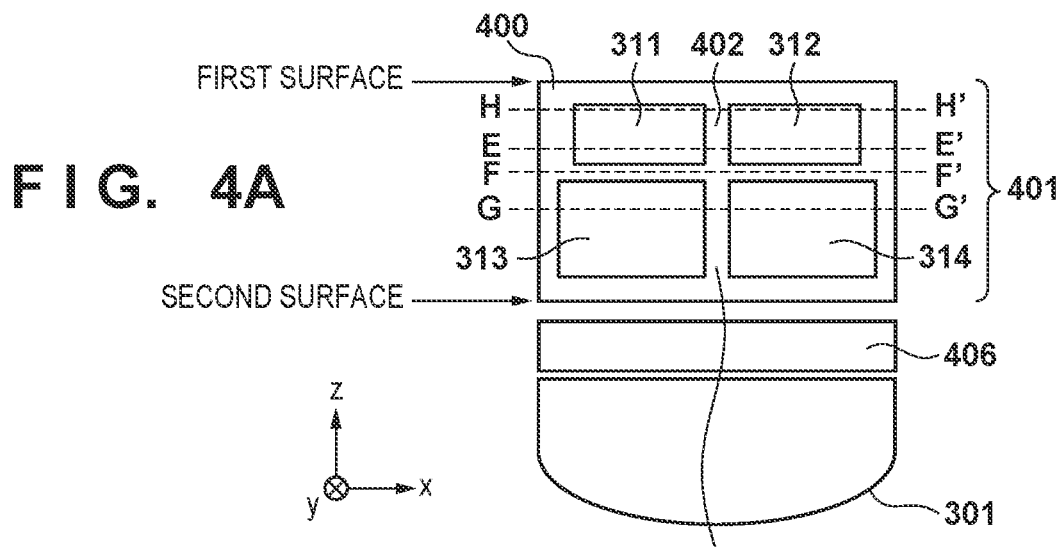
FIGS. 4A to 4C are cross-sectional views schematically showing cross-sectional structures of the pixel shown in FIG. 3.
Figure 4B:
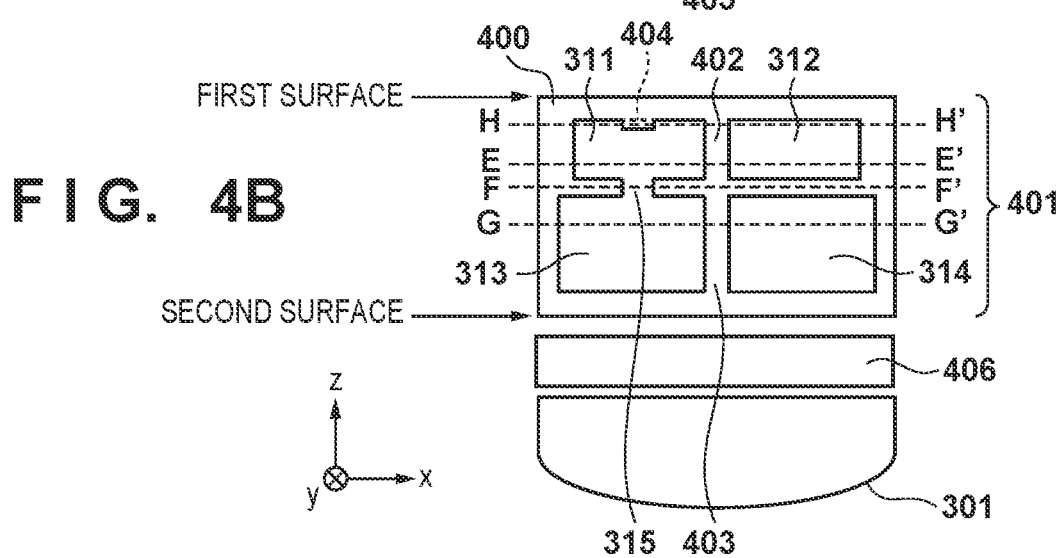
Figure 4C:
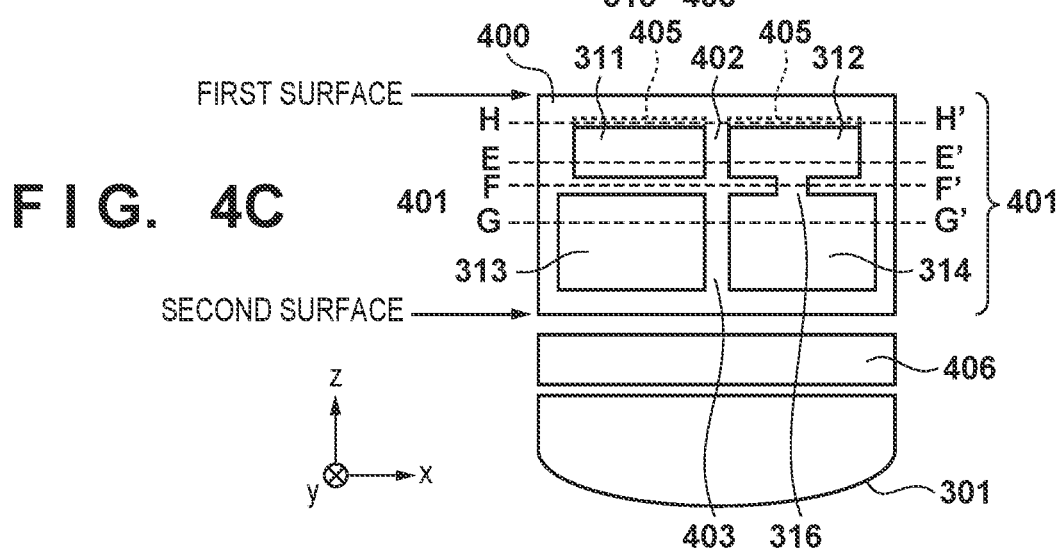

FIGS. 4A to 4C are diagrams schematically showing a basic cross-sectional structure of the pixel 105. FIG. 4A is a schematic view of an A-A' cross section of FIG. 3, FIG. 4B is a schematic view of a B-B' cross section of FIG. 3, and FIG. 4C is a schematic view of a C-C' cross section of FIG. 3. The pixel 105 of the present embodiment is arranged on a semiconductor substrate 401, and the semiconductor substrate 401 has a first surface and a second surface facing the first surface. The first surface is the front surface of the semiconductor substrate 401, and the second surface is the back surface of the semiconductor substrate 401. The direction from the second surface to the first surface is the positive direction in the Z direction. Transistor gate electrodes, a multilayer wiring structure, and the like are arranged on the first surface (front surface) side of the semiconductor substrate 401. Further, on the second surface (back surface) side of the semiconductor substrate 401, optical structures such as a color filter 406 and the ML 301 that collectively cover the two photodiodes of each pixel are arranged, and light is incident on the second surface (back surface) side.

As shown in FIG. 4A, in the semiconductor substrate 401, a P-type semiconductor region 400, and the accumulation regions 311 and 312 and sensitivity regions 313 and 314 surrounded by the P-type semiconductor region 400 are arranged. The accumulation region 311 and sensitivity region 313, as well as the accumulation region 312 and sensitivity region 314 have different shapes in a plan view, and parts of their regions overlap in the plan view. Further, as described above, the accumulation regions 311 and 312 and the sensitivity regions 313 and 314 are formed at different depths, and the accumulation regions 311 and 312 are formed at a depth closer to the first surface side (first depth), and the sensitivity regions 313 and 314 are formed at a depth closer to the second surface side (second depth). Of the P-type semiconductor region 400, an accumulation separation region 402 separates the accumulation region 311 and the accumulation region 312, and a sensitivity separation region 403 separates the sensitivity region 313 and the sensitivity region 314.

As shown in FIG. 4B, the accumulation region 311 and the sensitivity region 313 are connected in the depth direction via the N-type connecting region 315. Further, as shown in FIG. 4C, the accumulation region 312 and the sensitivity region 314 are connected in the depth direction via the N-type connecting region 316.

Further, in FIG. 4B, a region 404 in the accumulation region 311 has a shape recessed in the Z direction and filled with the P-type semiconductor, and the recessed region 404 suppresses the generation of charge accumulation in the region that overlaps with the N-type connecting region 315 in the plan view on the first surface side of the accumulation region 311. As a result, when the signal charge accumulated in the accumulation region 311 in the PDA 201 is transferred to the FD 205, the residue of the signal charge in the PDA 201 is suppressed. Note that the present invention is not limited to form the recessed region 404 in order to suppress the residue of the signal charge, and another method such as lowering the impurity concentration of a part of the accumulation region 311 may be used as long as the residue of the signal charge can be suppressed.

Further, as shown in FIG. 4C, the lengths of the accumulation regions 311 and 312 in the Z direction are shorter than the lengths of the accumulation regions 311 and 312 in the Z direction in the cross sections shown in FIGS. 4A and 4B. Regions 405 corresponding to the length by which the accumulation regions 311 and 312 in the Z direction are shortened are filled with a P-type semiconductor. The reason for changing the length in this way will be described later in detail.

FIGS. 5A to 5D are XY cross-sectional views of the PDA 201 and PDB 202 at different depths in the Z direction. FIG. 5A is a cross-sectional view taken along the line E-E' of FIGS. 4A to 4C, FIG. 5B is a cross-sectional view taken along the line F-F' of FIGS. 4A to 4C, and FIG. 5C is a cross-sectional view taken along the line G-G' of FIGS. 4A to 4C, and FIG. 5D is a cross-sectional view taken along the line H-H' of FIGS. 4A-4C. As shown in FIG. 5D, in the partial regions of accumulation regions 311 and 312 located away from the gate electrodes 303 and 304, as described with reference to FIG. 4C, the accumulation regions 311 and 312 are not formed and replaced by the notched region 405 of the P-type semiconductor.

Figure 6:
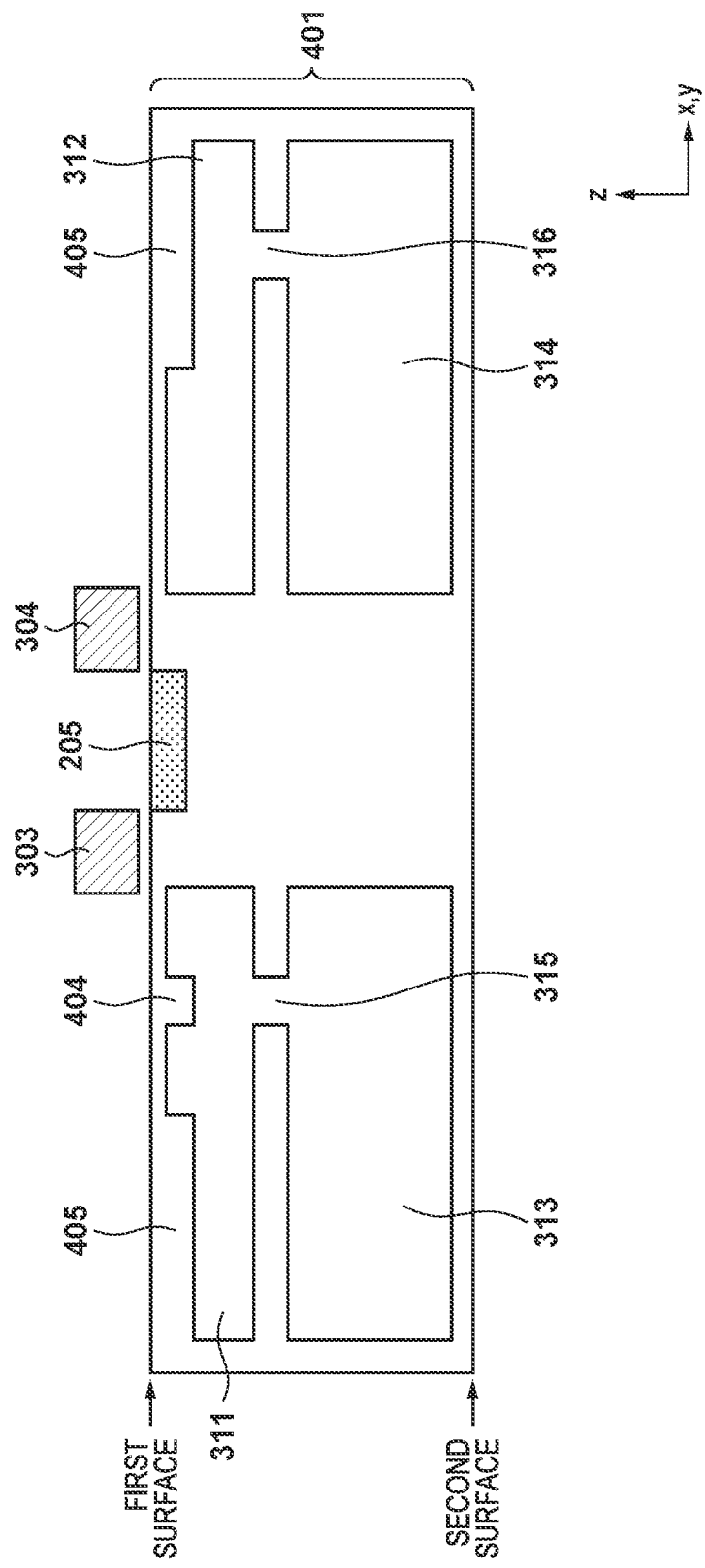
FIG. 6 is a cross-sectional view schematically showing a cross-sectional structure of the pixel in which sensitivity regions and N-type connecting regions of the pixel shown in FIG. 3 are included.

FIG. 6 is a schematic cross-sectional view taken along the line D-D' of FIG. 3. The accumulation regions 311 and 312, sensitivity regions 313 and 314, and N-type connecting regions 315 and 316 are shown in the same figure by expanding the XY plane along the line D-D' in FIG. 3. When light is incident on the second surface of the semiconductor substrate 401 via the ML 301 during a charge accumulation period, electrons (signal charge) are generated mainly in the sensitivity regions 313 and 314 by photoelectric conversion. Most of the signal charge generated in the sensitivity region 313 moves to accumulation region 311 via the N-type connecting region 315 and is accumulated there. In addition, most of the signal charge generated in the sensitivity region 314 moves to the accumulation region 312 via the N-type connecting region 316 and is accumulated there. In order to realize signal charge transfer from the sensitivity region to the accumulation region, it is desirable that the potential that affects the electrons monotonically decreases on the charge transfer path from the sensitivity region to the accumulation region.

Examples of Arrangement of Accumulation Regions and Sensitivity Regions

Since the accumulation regions and the sensitivity regions are arranged at different depths, it is possible to design the shapes of the accumulation regions and the sensitivity regions so as to extend in the different directions. Below, examples of arrangements of the accumulation regions and the sensitivity regions will be described with reference to FIGS. 7A to 10C. The constituents having the same functions as the constituents shown in FIGS. 3 and 4A to 4C described above are designated by the same reference numerals.

FIGS. 7A to 7C are schematic views showing a first arrangement of the semiconductor regions according to the present embodiment. In the following description, the pixel 105 having the first arrangement is referred to as a pixel 700.

FIG. 7A is an exploded perspective view of the accumulation regions 311 and 312, sensitivity regions 313 and 314, N-type connecting regions 315 and 316, gate electrode 303 of the TXA 203, gate electrode 304 of the TXB 204, and FD 205 in the pixel 700. In the first arrangement, all of the accumulation regions 311 and 312 and the sensitivity regions 313 and 314 extend in the y direction, that is, in the same direction.

FIG. 7B is a schematic plan view showing the positional relationship of the accumulation regions 311 and 312, sensitivity regions 313 and 314, N-type connecting regions 315 and 316, gate electrode 303 of the TXA 203, gate electrode 304 of the TXB 204, and FD 205 in the plan view of the pixel 700. In the first arrangement, since the sensitivity regions 313 and 314 where charges are generated by the photoelectric conversion are laid out in the x direction, it is possible to acquire phase difference signals whose pupil division direction is the x direction. A reference numeral 701 indicates the division direction of the phase difference signals.

FIG. 7C is a schematic plan view showing the positional relationship between the accumulation separation region 402 and the sensitivity separation region 403 in the plan view of the pixel 700. In the first arrangement, both the accumulation separation region 402 and the sensitivity separation region 403 extend in the y direction.

FIGS. 8A to 8C are schematic views showing a second arrangement of the semiconductor regions according to the present embodiment. In the following description, the pixel 105 having the second arrangement is referred to as a pixel 800.

FIG. 8A is an exploded perspective view of the accumulation regions 311 and 312, sensitivity regions 313 and 314, N-type connecting regions 315 and 316, gate electrode 303 of the TXA 203, gate electrode 304 of the TXB 204, and FD 205 in the pixel 800. In the second arrangement, the accumulation regions 311 and 312 extend in the y direction and the sensitivity regions 313 and 314 extend in the x direction which is orthogonal to the y direction, that is, in the different direction.

FIG. 8B is a schematic plan view showing the positional relationship of the accumulation regions 311 and 312, sensitivity regions 313 and 314, N-type connecting regions 315 and 316, gate electrode 303 of the TXA 203, gate electrode 304 of the TXB 204, and FD 205 in the plan view of the pixel 800. In the second arrangement, since the sensitivity regions 313 and 314 where charges are generated by the photoelectric conversion are laid out in the y direction, it is possible to acquire phase difference signals whose pupil division direction is the y direction. A reference numeral 801 indicates the division direction of the phase difference signals.

FIG. 8C is a schematic plan view showing the positional relationship between the accumulation separation region 402 and the sensitivity separation region 403 in the plan view of the pixel 800. In the second arrangement, the accumulation separation region 402 extends in the y direction, and the sensitivity separation region 403 extends in the x direction.

As described above, when the extending direction of the sensitivity regions 313 and 314 and the extending direction of the accumulation regions 311 and 312 are orthogonal to each other, the sensitivity separation region 403 overlaps with the accumulation regions 311 and 312 in a plan view. In the regions of the accumulation region 311 and the accumulation region 312 that overlap with the sensitivity separation region 403 in a plan view, the N-type concentration becomes thin due to the influence of injection of P-type impurities for forming the sensitivity separation region 403. Therefore, by shortening the thickness of the accumulation regions 311 and 312 in the Z direction at locations away from the gate electrode 303 of TXA 203 and the gate electrode 304 of TXB 204, the residue of the signal charge in the regions where the N-type concentration becomes low is suppressed. However, as long as the residue of the signal charge can be suppressed, another method such as lowering the concentration of impurities in parts of the accumulation regions 311 and 312 may be used.

Figures 9A, 9B, 9C:
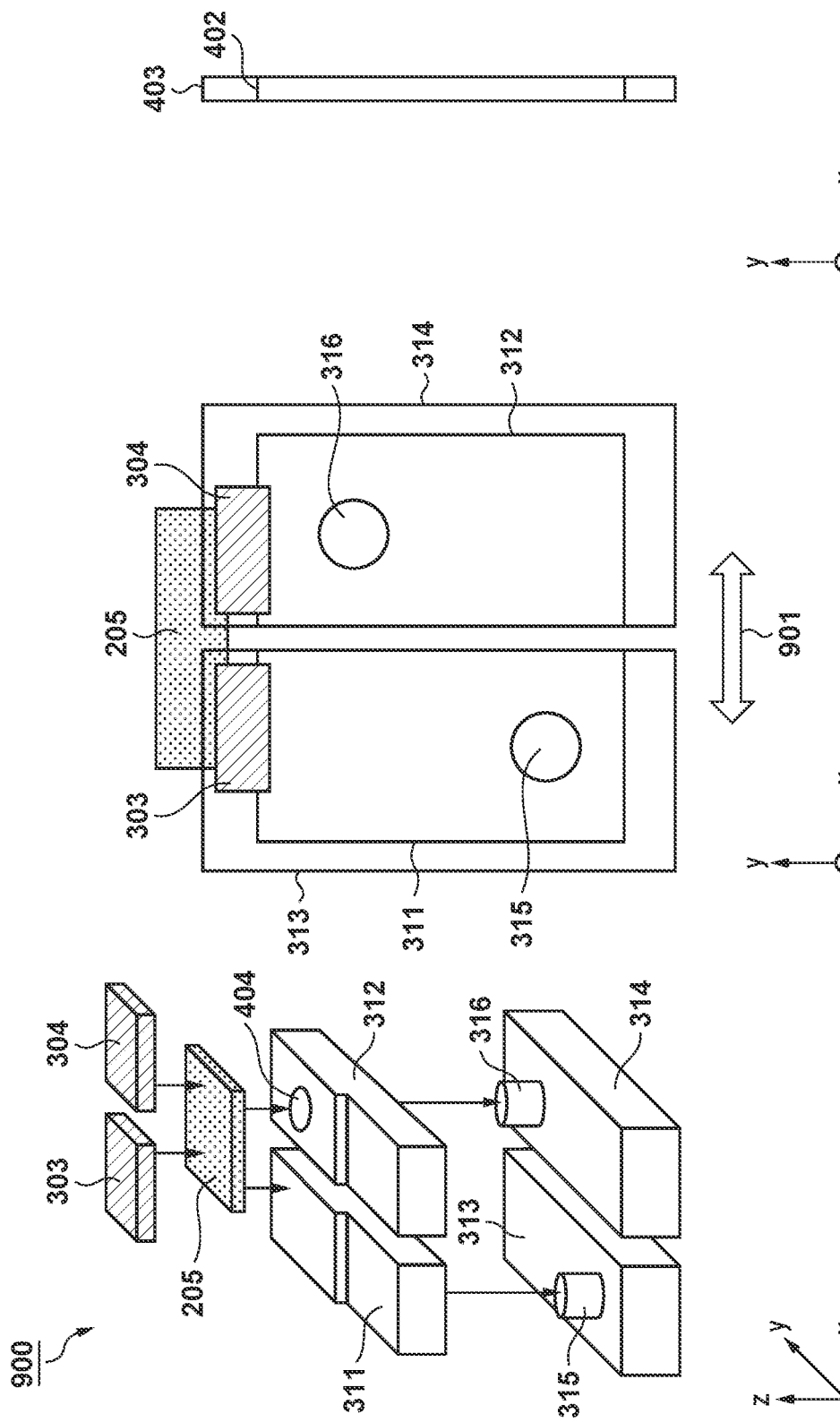
FIGS. 9A to 9C are schematic views showing a third arrangement of semiconductor regions in the first embodiment.

FIGS. 9A to 9C are schematic views showing a third arrangement of the semiconductor regions according to the present embodiment. In the following description, the pixel 105 having the third arrangement is referred to as a pixel 900. In the third arrangement, the position of the recessed region 404 and the positions of the N-type connecting regions 315 and 316 are different from those of the first arrangement shown in FIGS. 7A to 7C.

FIG. 9A is an exploded perspective view of the accumulation regions 311 and 312, sensitivity regions 313 and 314, N-type connecting regions 315 and 316, gate electrode 303 of the TXA 203, gate electrode 304 of the TXB 204, and FD 205 in the pixel 700. In the third arrangement, all of the accumulation regions 311 and 312 and the sensitivity regions 313 and 314 extend in the same direction (y direction) similarly to the first arrangement.

FIG. 9B is a schematic plan view showing the positional relationship of the accumulation regions 311 and 312, sensitivity regions 313 and 314, N-type connecting regions 315 and 316, gate electrode 303 of the TXA 203, gate electrode 304 of the TXB 204, and FD 205 in the plan view of the pixel 900. In the third arrangement, similarly to the first arrangement, since the sensitivity regions 313 and 314 are laid out in the x direction, it is possible to acquire phase difference signals whose pupil division direction is the x direction. A reference numeral 901 indicates the division direction of the phase difference signals.

FIG. 9C is a schematic plan view showing the positional relationship between the accumulation separation region 402 and the sensitivity separation region 403 in the plan view of the pixel 900. In the third arrangement, similarly to the first arrangement, both the accumulation separation region 402 and the sensitivity separation region 403 extend in the y direction.

Figures 10A, 10B, 10C:
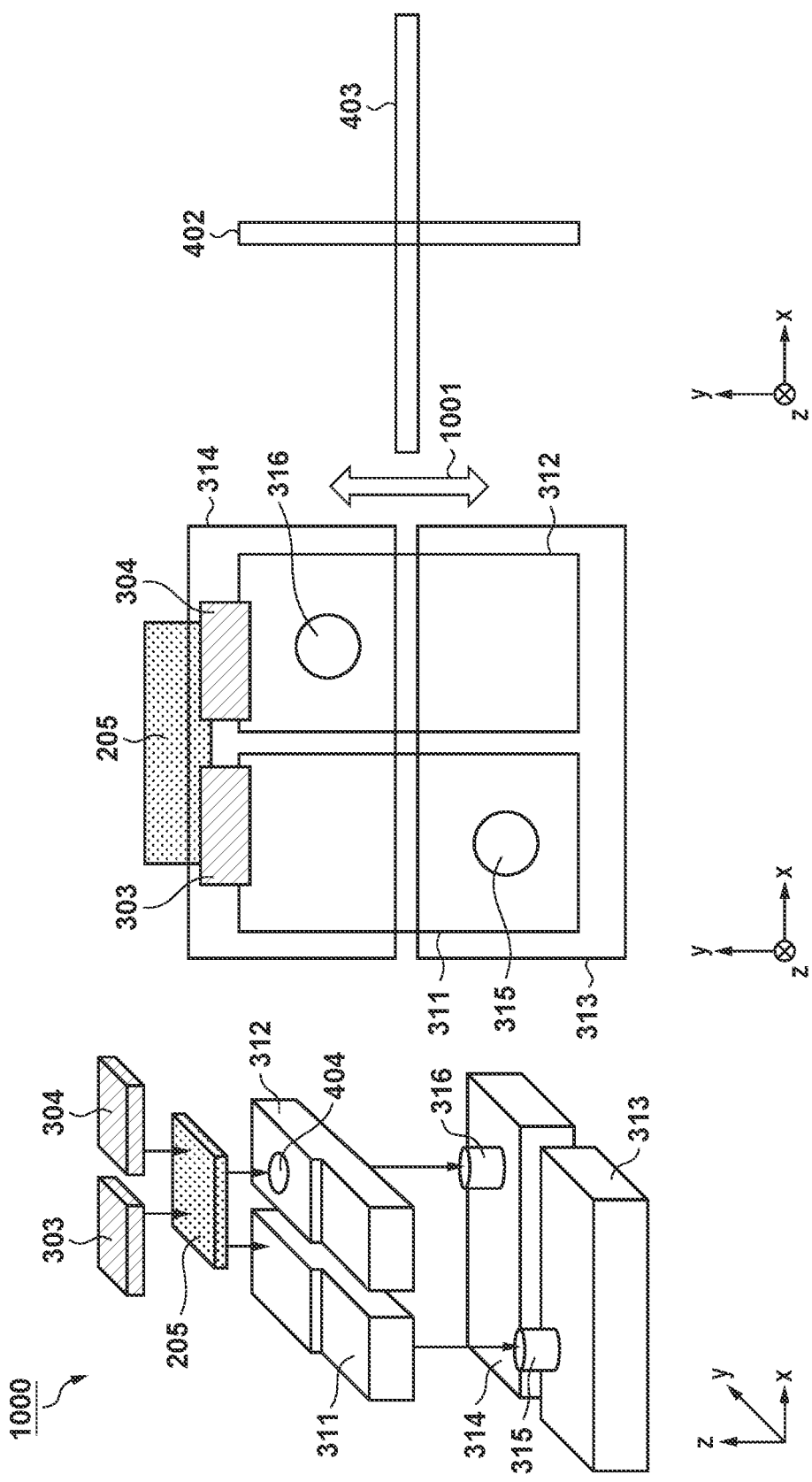
FIGS. 10A to 10C are schematic views showing a fourth arrangement of semiconductor regions in the first embodiment.

FIGS. 10A to 10C are schematic views showing a fourth arrangement of the semiconductor regions according to the present embodiment. In the following description, the pixel 105 having the fourth arrangement is referred to as a pixel 1000. In the fourth arrangement, the position of the recessed region 404 and the positions of the N-type connecting regions 315 and 316 are different from those of the second arrangement shown in FIGS. 8A to 8C, which causes different connection between the accumulation regions 311 and 312, and the sensitivity regions 313 and 314.

FIG. 10A is an exploded perspective view of the accumulation regions 311 and 312, sensitivity regions 313 and 314, N-type connecting regions 315 and 316, gate electrode 303 of the TXA 203, gate electrode 304 of the TXB 204, and FD 205 in the pixel 1000. In the fourth arrangement, the accumulation regions 311 and 312 extend in the y direction and the sensitivity regions 313 and 314 extend in the x direction which is orthogonal to the y direction in the plan view.

FIG. 10B is a schematic plan view showing the positional relationship of the accumulation regions 311 and 312, sensitivity regions 313 and 314, N-type connecting regions 315 and 316, gate electrode 303 of the TXA 203, gate electrode 304 of the TXB 204, and FD 205 in the plan view of the pixel 1000. In the fourth arrangement, since the sensitivity regions 313 and 314 where charges are generated by the photoelectric conversion are laid out in the y direction, it is possible to acquire phase difference signals whose pupil division direction is the y direction. A reference numeral 1001 indicates the division direction of the phase difference signals.

FIG. 10C is a schematic plan view showing the positional relationship between the accumulation separation region 402 and the sensitivity separation region 403 in the plan view of the pixel 800. In the fourth arrangement, the accumulation separation region 402 extends in the y direction, and the sensitivity separation region 403 extends in the x direction.

In the fourth arrangement, too, in the regions of the accumulation region 311 and the accumulation region 312 that overlap with the sensitivity separation region 403 in a plan view, the N-type concentration becomes thin due to the influence of injection of P-type impurities for forming the sensitivity separation region 403. Therefore, by shortening the thickness of the accumulation regions 311 and 312 in the Z direction at locations away from the gate electrode 303 of TXA 203 and the gate electrode 304 of TXB 204, the residue of the signal charge in the regions where the N-type concentration becomes low is suppressed. However, as long as the residue of the signal charge can be suppressed, another method such as lowering the concentration of impurities in parts of the accumulation regions 311 and 312 may be used.

As shown in FIGS. 7A to 10C, in the first to fourth arrangements, the arrangements of the accumulation regions 311 and 312, the gate electrode 303 of TXA 203, the gate electrode 304 of TXB 204, and the FD 205 are the same. Therefore, it is possible to make the layout of the RES 206, SF 208, SEL 207 and metal wiring the same in the first to fourth arrangements. As a result, the capacitance of the FD 205 can be made the same for all pixels, and a gain for converting the signal charge transferred to the FD 205 to the voltage and a gain for reading out the voltage of the SF 208 can be set equal for all pixels.

Pixel Layout

Next, an example of pixel layout of the pixels 700, 800, 900, 1000 having the above configurations will be described.

Figure 11:
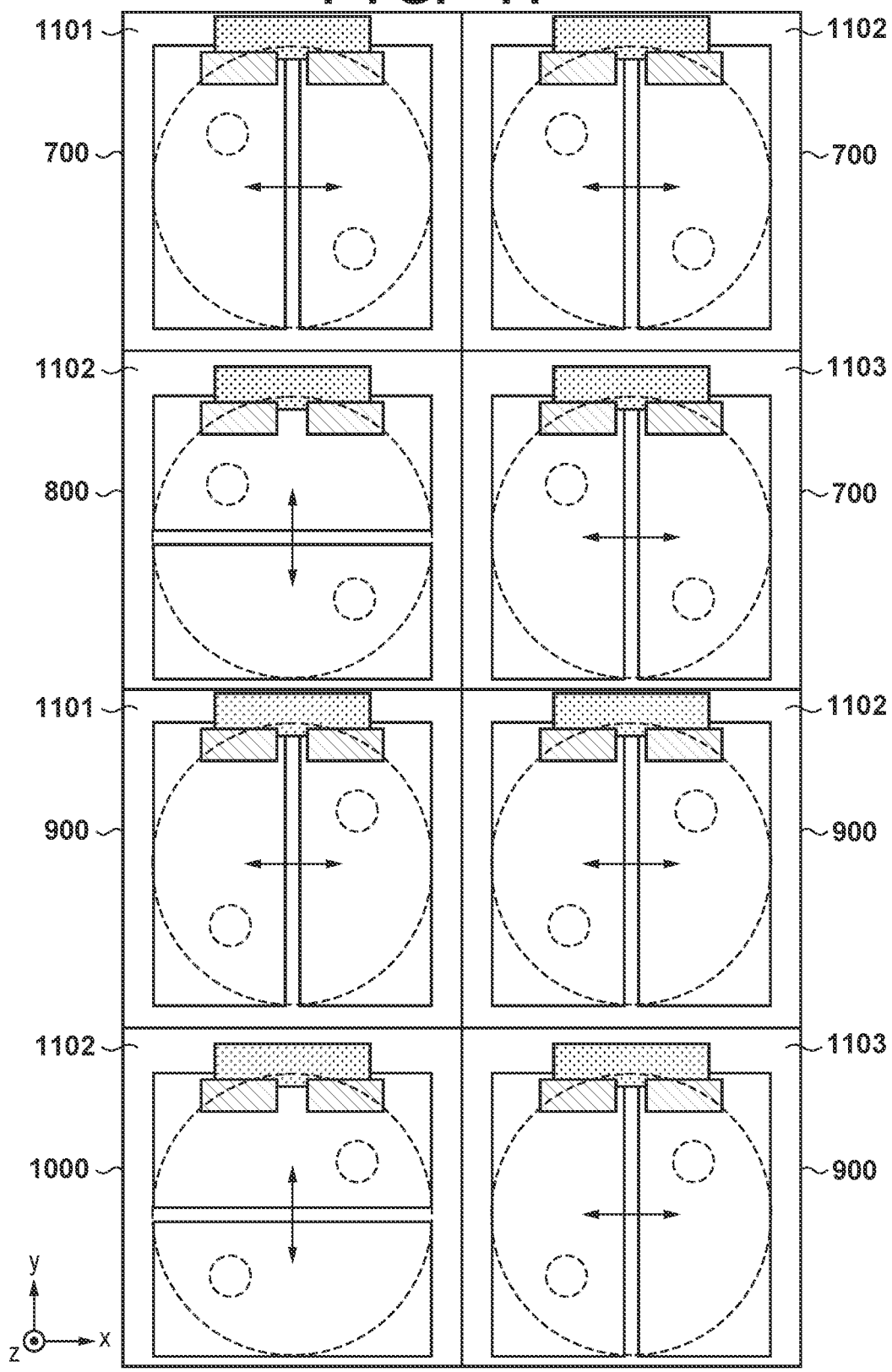
FIG. 11 is a diagram schematically showing a pixel array in the first embodiment in a range of 4 rows×2 columns.

FIG. 11 is a schematic diagram showing the pixel layout of the pixel array 101 in the range of 4 rows×2 columns. By laying out a large number of sets of pixels of 4 rows×2 columns shown in FIG. 11 on a plane, the imaging signal and the phase difference signals can be acquired. In FIG. 11, the ML 301, sensitivity regions 313 and 314, N-type connecting regions 315 and 316, gate electrode 303 of the TXA 203, gate electrode 304 of the TXB 204, FD 205, division directions of phase difference signals, and color filter 406 are shown.

A color filter (CFR) 1101 having an R (red) spectral transmission characteristic, a color filter (CFG) 1102 having a G (green) spectral transmission characteristic, and a color filter 1103 having a B (blue) spectral transmission characteristic are used as the color filters 406. These color filters 406 are arranged in a Bayer array. Further, in the example shown in FIG. 11, pixels are arranged in the order of pixel 700, pixel 700, pixel 900, and pixel 900 from the top to the bottom of the right column. Further, pixels are arranged in the order of pixel 700, pixel 800, pixel 900, and pixel 1000 from the top to the bottom of the left column.

By using the phase difference signals acquired from the pixels 700 and the pixels 900, it is possible to acquire the phase difference signals whose pupil division direction is the x direction. Further, by using the phase difference signal acquired from the pixel 800 and the pixel 1000, it is possible to acquire the phase difference signals whose pupil division direction is the y direction. Phase difference signals whose pupil division direction is the x direction is more effective in a case where the contrast in the x direction is high, such as when the subject has a pattern close to a vertical stripe pattern. On the other hand, the phase difference signals whose pupil division direction is the y direction is more effective in a case where the contrast in the y direction is high, such as when the subject has a pattern close to a horizontal stripe pattern.

The accumulation regions of the pixels arranged as described above are divided into type 1 and type 2. In the type 1, the accumulation region is adjacent to both the recessed region 404 and the notched region 405 of the P-type semiconductor (accumulation region 311 of the pixel 700, accumulation region 311 of the pixel 800, accumulation region 312 of the pixel 900, and accumulation region 312 of the pixel 1000). In the type 2, the accumulation region is adjacent only to the notched region 405 of the P-type semiconductor (accumulation region 312 of the pixel 700, accumulation region 312 of the pixel 800, accumulation region 311 of the pixel 900, accumulation region 311 of the pixel 1000). Since the volume of the N-type region of the accumulation region in the type 1 is smaller than that of the accumulation region in the type 2, the amount of signal charge that can be stored in the accumulation region in the type 1 may be smaller.

Since the imaging signal is a signal obtained by adding the signal A and the signal B, the saturation charge amount of the imaging signal is uniform in all the pixels. On the other hand, since the phase difference signals use the signal A and the signal B independently, the saturation charge amounts of the phase difference signals are different between the first arrangement and the second arrangement, and between the third arrangement and the fourth arrangement. In consideration of the above feature, a large number of sets of the pixels arranged as shown in FIG. 11 are arranged on a plane to form the pixel array 101, and by performing signal processing such as averaging or using only the signals of specific pixels in accordance with the arrangement of the pixels, the saturated charge amounts of the phase difference signals obtained in the entire region of the pixel array 101 can be made uniform.

For example, if the intensity distribution of the phase difference signals obtained only from the pixels 700 and the intensity distribution of the phase difference signals obtained only from the pixels 900 have shapes significantly different from each other, there is a high possibility that the phase difference signals of the either of the pixels 700 and 900 will be saturated. In such a case, of the phase difference signals only from the pixels 700 and the phase difference signals only from the pixels 900, it is conceivable that the phase difference signals having a smaller signal intensity difference between the signal A and the signal B will include a saturated phase difference signal. Accordingly, the focus detection is performed using the phase difference signals from the pixels 700 or 900 having the larger signal intensity difference between the signal A and the signal B. By doing so, the phase difference signals from the pixels having a larger saturation charge amount can be used, and thereby it is possible to make the saturation charge amounts of the phase difference signals to be used uniform in the entire region of the pixel array.

Further, by arranging the pixels as in the present embodiment, even in cases where the mutual relationship between the accumulation regions 311 and 312, the N-type connecting regions 315 and 316, and the P-type regions 404 and 405 varies due to the alignment variation at the time of manufacturing and the amounts of charge that can be accumulated in accumulation regions 311 and 312 deviate from the designed structure, the saturated charge amounts of the phase difference signals can be made uniform by performing signal processing such as averaging or using only specific signals according to the arrangement of the semiconductor regions in each pixel.

As described above, according to the first embodiment, it is possible to make the capacitances of the FD and the saturated charge amounts uniform while making the pupil division directions to two, so that it is possible to acquire image data that does not require interpolation processing.

<Modification>

Next, a modification of the first embodiment will be described. The constituents having the same functions as those in the first embodiment are designated by the same reference numerals, and the description thereof will be omitted or simplified as appropriate. In this modification, another example of pixel layout will be described.

Figure 12:
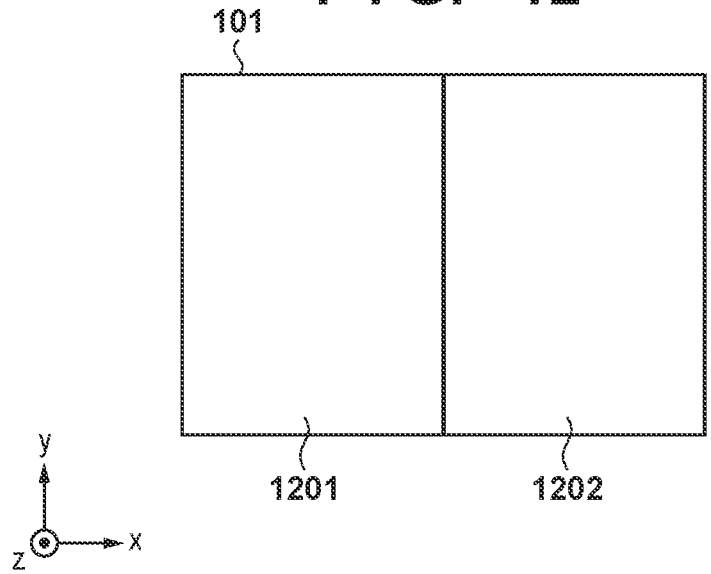
FIG. 12 is a schematic diagram for explaining a pixel array in a modification.

FIG. 12 is a schematic view showing the pixel array 101 in the modification of the first embodiment, and a partial pixel array 1201 on the left side and a partial pixel array 1202 on the right side with respect to the center in the x direction in FIG. 12 have different pixel layouts.

Figure 13:
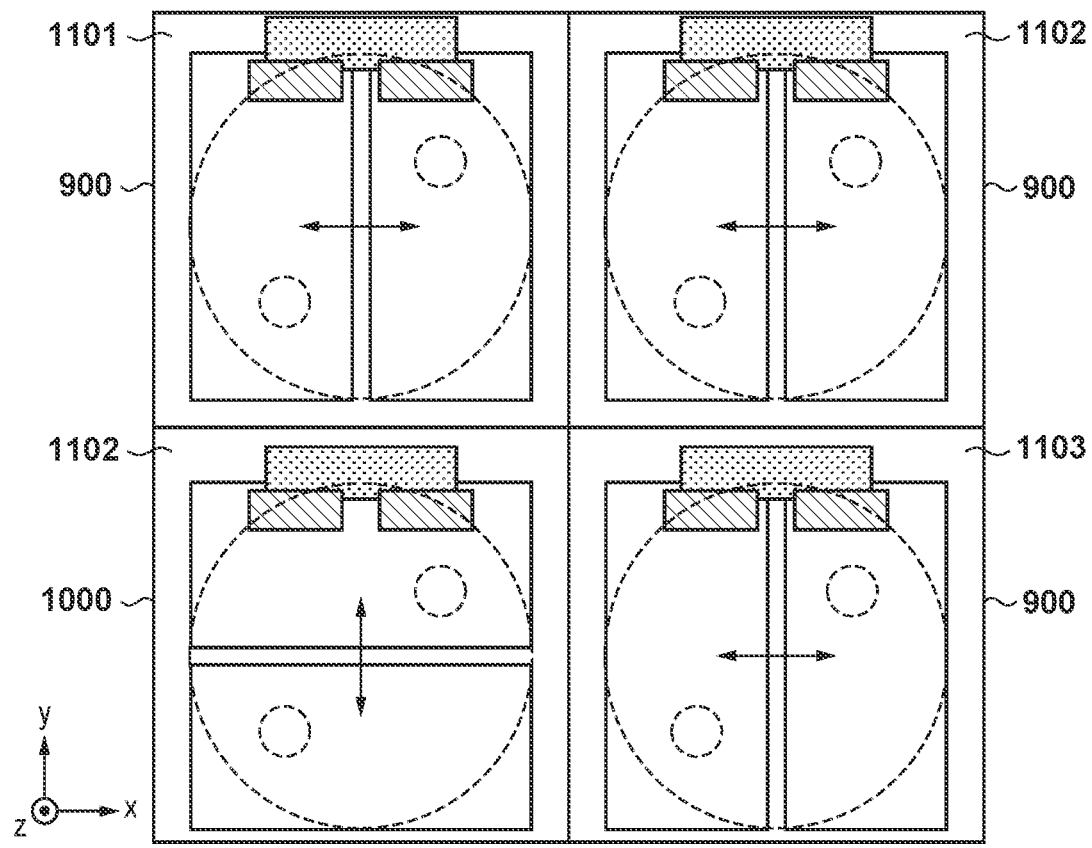
FIG. 13 is a diagram schematically showing a pixel array in the modification in a range of 2 rows×2 columns.

FIG. 13 is a schematic diagram showing the pixel layout of the partial pixel array 1201 in the range of 2 rows×2 columns, and the partial pixel array 1201 is configured by laying out a large number of sets of the pixels of the 2 rows×2 columns shown in FIG. 13 on a plane. The color filter arrangement is CFG 1102 and CFB 1103 from the top to the bottom in the right column, and CFR 1101 and CFG 1102 from the top to the bottom in the left column. The arrangement of the semiconductor regions is shown by the pixel 900 and pixel 900 from the top to the bottom in the right column, and the pixel 900 and pixel 1000 from the top to the bottom in the left column.

Figure 14:
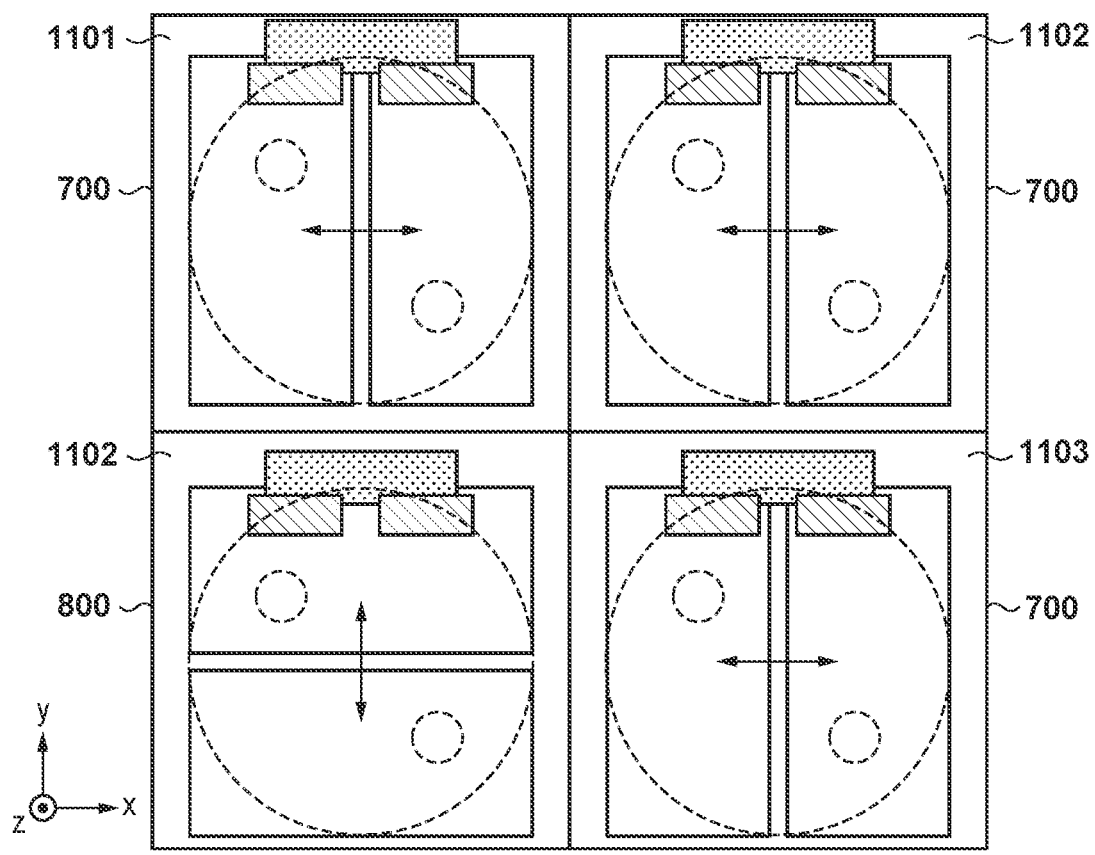
FIG. 14 is a diagram schematically showing a pixel array in the modification in a range of 2 rows×2 columns.

FIG. 14 is a schematic diagram showing the pixel layout of the partial pixel array 1202 in the range of 2 rows×2 columns, and the partial pixel array 1202 is configured by arranging a large number of sets of the pixels of the 2 rows×2 columns shown in FIG. 14 on a plane. The color filter arrangement is CFG 1102 and CFB 1103 from the top to the bottom in the right column, and CFR 1101 and CFG 1102 from the top to the bottom in the left column. The arrangement of the semiconductor region is shown by the pixel 700 and pixel 700 from the top to the bottom in the right column, and the pixel 700 and pixel 800 from the top to the bottom in the left column.

In the partial pixel array 1201, when detecting the phase difference in the x direction, the phase difference signals acquired from the pixels 900 are used. In the pixel 900, the sensitivity region connected to the type 2 accumulation region, which has a larger saturation charge amount than the type 1 accumulation region, is arranged on the side in the pixel where the x-coordinate is relatively small. On the other hand, in the partial pixel array 1202, when performing the phase difference detection in the x direction, the phase difference signals acquired from the pixels 700 are used. In the pixel 700, the sensitivity region connected to the type 2 accumulation region is arranged on the side in the pixel where the x-coordinate is relatively large. By laying out pixels in this way, the saturation charge amount of the phase difference signals can be increased in each pixel in a case where a larger amount of light is incident on the side away from the center of the pixel array.

In this modification, the microlens is optically designed to be formed by eccentricity toward the intersection of the pixel array and the optical axis according to the distance from the intersection, so that the center of pupil division intersects the optical axis at a fixed distance from the pixel array for all the pixels. This distance will be called a sensor pupil distance below. In a case where the exit pupil distance of the imaging lens is shorter than the sensor pupil distance, more light is incident on the side of each pixel far from the intersection with the optical axis than on the side of each pixel closer to the intersection. In this modification, since the sensitivity region connected to the accumulation region having a larger saturation charge amount is arranged on the side in each pixel far from the optical axis, the saturation charge amounts of the phase difference signals become large.

Thus, by adopting the pixel array layout as in the modification of the first embodiment, the saturation charge amount of the phase difference signal can be increased according to the relationship between the sensor pupil distance and the exit pupil distance of the imaging lens.

Second Embodiment

Next, a second embodiment of the present invention will be described.

In the second embodiment, a configuration in which a pixel signal reading circuit constituted with the FD 205 and its subsequent elements is shared by two pixels will be described. The constituents having the same functions as those in the first embodiment are designated by the same reference numerals, and detailed description thereof will be omitted or simplified.

FIG. 15 is an equivalent circuit diagram of two pixels in the second embodiment. In order to distinguish the photodiodes of the two pixels, the pixel on the upper side of the drawing is referred to as a pixel 105U and the two photodiodes of the pixel 105U are hereinafter referred to as PD1A 1501 and PD1B 1502. Further, the pixel on the lower side of the drawing is referred to as a pixel 105D and the two photodiodes of the pixel 105D are referred to as PD2A 1503 and PD2B 1504.

PD1A 1501 and PD1B 1502 share one microlens 301, and PD2A 1503 and PD2B 1504 share one microlens. The two pixels, namely, the pixel 105U and the pixel 105D, share the pixel signal reading circuit constituted with FD 205, RES 206, SEL 207, and SF 208.

The signal charge obtained by photoelectric conversion according to the amount of incident light by the PD1A 1501 and accumulated in the PD1A 1501 is transferred to the FD 205 via a transfer switch (TX1A) 1505. Further, the signal charge obtained by photoelectric conversion and accumulated in the PD1B 1502 is transferred to the FD 205 via a transfer switch (TX1B) 1506. Similarly, the signal charge obtained by photoelectric conversion and accumulated in the PD2A 1503 is transferred to the FD 205 via a transfer switch (TX2A) 1507, and the signal charge obtained by photoelectric conversion and accumulated in the PD2B 1504 is transferred to the FD 205 via a transfer switch (TX2B) 1508.

Examples of Arrangement of Accumulation Regions and Sensitivity Regions

Figure 16A:
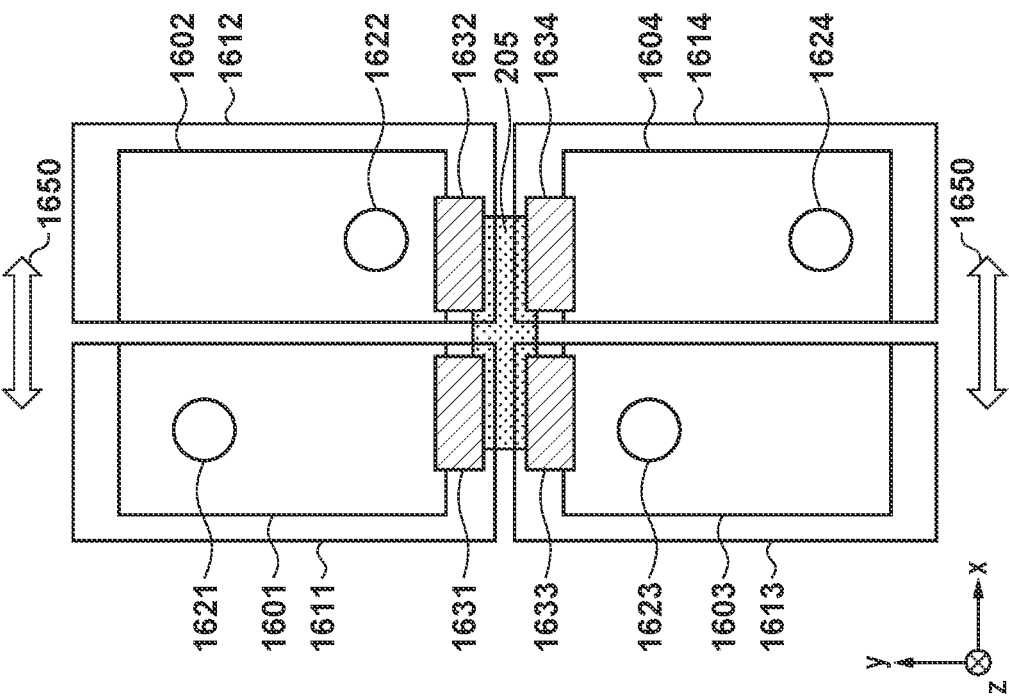
FIGS. 16A and 16B are schematic views showing a fifth arrangement of semiconductor regions in the second embodiment.
Figure 16B:
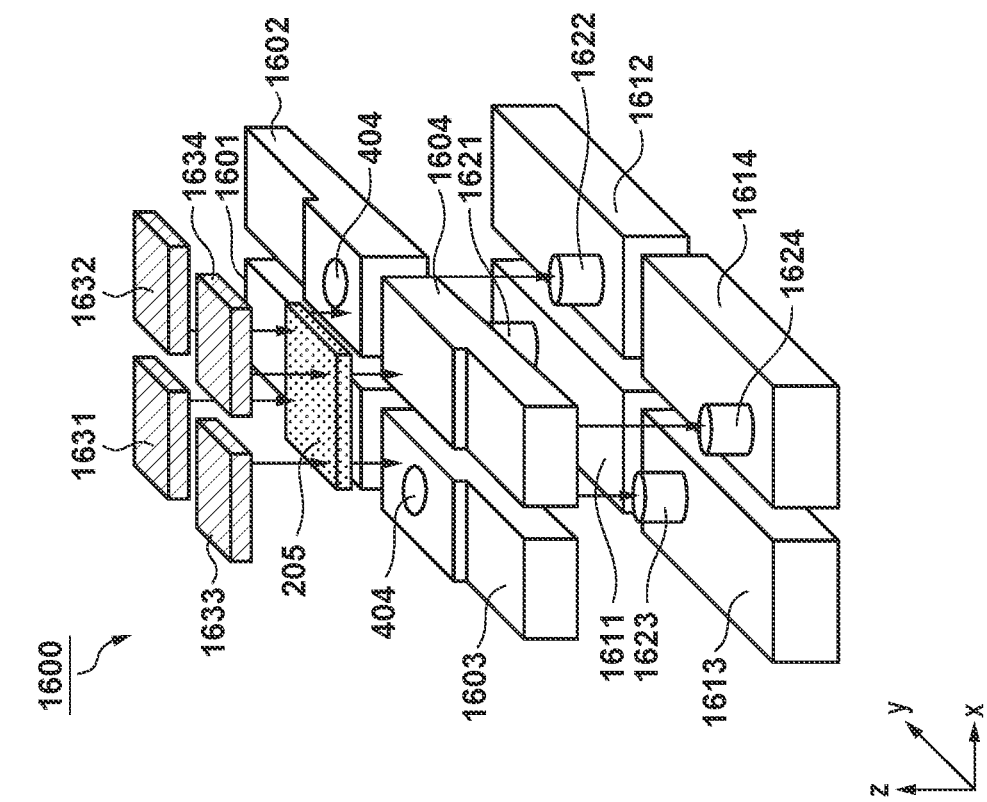

FIGS. 16A and 16B are schematic views showing a fifth arrangement of the semiconductor regions of the two pixels according to the second embodiment. In the following description, the two pixels 105U and 105D having the fifth arrangement are referred to as a pixel set 1600.

FIG. 16A is an exploded perspective view of accumulation regions 1601, 1602, 1603 and 1604, sensitivity regions 1611, 1612, 1613 and 1614, N-type connecting regions 1621, 1622, 1623 and 1624, gate electrode 1631 of the TX1A 1505, gate electrode 1632 of the TX1B 1506, gate electrode 1633 of the TX2A 1507, gate electrode 1634 of the TX2B 1508, and FD 205 in the pixel set 1600.

The PD1A 1501 shown in FIG. 15 is composed of the accumulation region 1601, sensitivity region 1611, and N-type connecting region 1621, and the PD1B 1502 is composed of the accumulation region 1602, sensitivity region 1612, and N-type connecting region 1622. The PD2A 1503 is composed of the accumulation region 1603, sensitivity region 1613, and N-type connecting region 1623, and the PD2B 1504 is composed of the accumulation region 1604, sensitivity region 1614, and N-type connecting region 1624. The PD1A 1501 and PD1B 1502 constituting the pixel 105U are arranged on the side having a relatively large y coordinate with respect to the FD 205, and the PD2A 1503 and PD2B 1504 constituting the pixel 105D are arranged on the side have a relatively small y coordinate with respect to the FD 205.

FIG. 16B is a schematic plan view showing the positional relationship of the accumulation regions 1601, 1602, 1603 and 1604, sensitivity regions 1611, 1612, 1613 and 1614, N-type connecting regions 1621, 1622, 1623 and 1624, gate electrode 1631 of the TX1A 1505, gate electrode 1632 of the TX1B 1506, gate electrode 1633 of the TX2A 1507, gate electrode 1634 of the TX2B 1508, and FD 205 in the plan view of the pixel set 1600. Since all of the sensitivity regions 1611 and 1612 of the pixel 105U and the sensitivity regions 1613 and 1614 of the pixel 105D extend in the y direction, it is possible to acquire phase difference signals whose pupil division direction is the x direction from both of the pixels 105U and 105D. Arrows 1650 indicate the division direction of the phase difference signals.

FIGS. 17A and 17B are schematic views showing a sixth arrangement of the semiconductor regions of the two pixels according to the second embodiment. In the following description, the two pixels 105U and 105D having the sixth arrangement are referred to as a pixel set 1700.

FIG. 17A is an exploded perspective view of the accumulation regions 1601, 1602, 1603 and 1604, sensitivity regions 1611, 1612, 1613 and 1614, N-type connecting regions 1621, 1622, 1623 and 1624, gate electrode 1631 of the TX1A 1505, gate electrode 1632 of the TX1B 1506, gate electrode 1633 of the TX2A 1507, gate electrode 1634 of the TX2B 1508, and FD 205 in the pixel set 1700. Further, FIG. 17B is a schematic plan view showing the positional relationship of constituents of the pixel set 1700 in the plan view.

The pixel set 1700 has the same configuration as that of the pixel set 1600 except for the extending directions of the sensitivity regions 1613 and 1614 of the pixel 105D are different. Similarly to the pixel set 1600, the pixel 105U has the sensitivity regions 1611 and 1612 extending in the y direction, and can acquire phase difference signals whose pupil division direction is the x direction. On the other hand, in the pixel 105D, since the sensitivity regions 1613 and 1614 extend in the x direction, it is possible to acquire phase difference signals whose pupil division direction is the y direction. Arrows 1750 and 1751 indicate the division directions of the phase difference signals.

FIGS. 18A and 18B are schematic views showing a seventh arrangement of the semiconductor regions of two pixels according to the second embodiment. In the following description, two pixels 105U and 105D having the seventh arrangement are referred to as a pixel set 1800.

FIG. 18A is an exploded perspective view of the accumulation regions 1601, 1602, 1603 and 1604, sensitivity regions 1611, 1612, 1613 and 1614, N-type connecting regions 1621, 1622, 1623 and 1624, gate electrode 1631 of the TX1A 1505, gate electrode 1632 of the TX1B 1506, gate electrode 1633 of the TX2A 1507, gate electrode 1634 of the TX2B 1508, and FD 205 in the pixel set 1800. Further, FIG. 18B is a schematic plan view showing the positional relationship of constituents of the pixel set 1800 in the plan view.

The pixel set 1800 has the same configuration as that of the pixel set 1600 except for the extending directions of the sensitivity regions 1613 and 1614 of the pixel 105U are different. Similarly to the pixel set 1600, the pixel 105D has the sensitivity regions 1613 and 1614 extending in the y direction, and can acquire phase difference signals whose pupil division direction is the x direction. On the other hand, in the pixel 105U, since the sensitivity regions 1611 and 1612 extend in the x direction, it is possible to acquire phase difference signals whose pupil division direction is they direction. Arrows 1850 and 1851 indicate the division directions of the phase difference signals.

Pixel Layout

Next, an example of pixel arrangement of the pixels 1600, 1700 and 1800 having the above configurations will be described.

Figure 19:
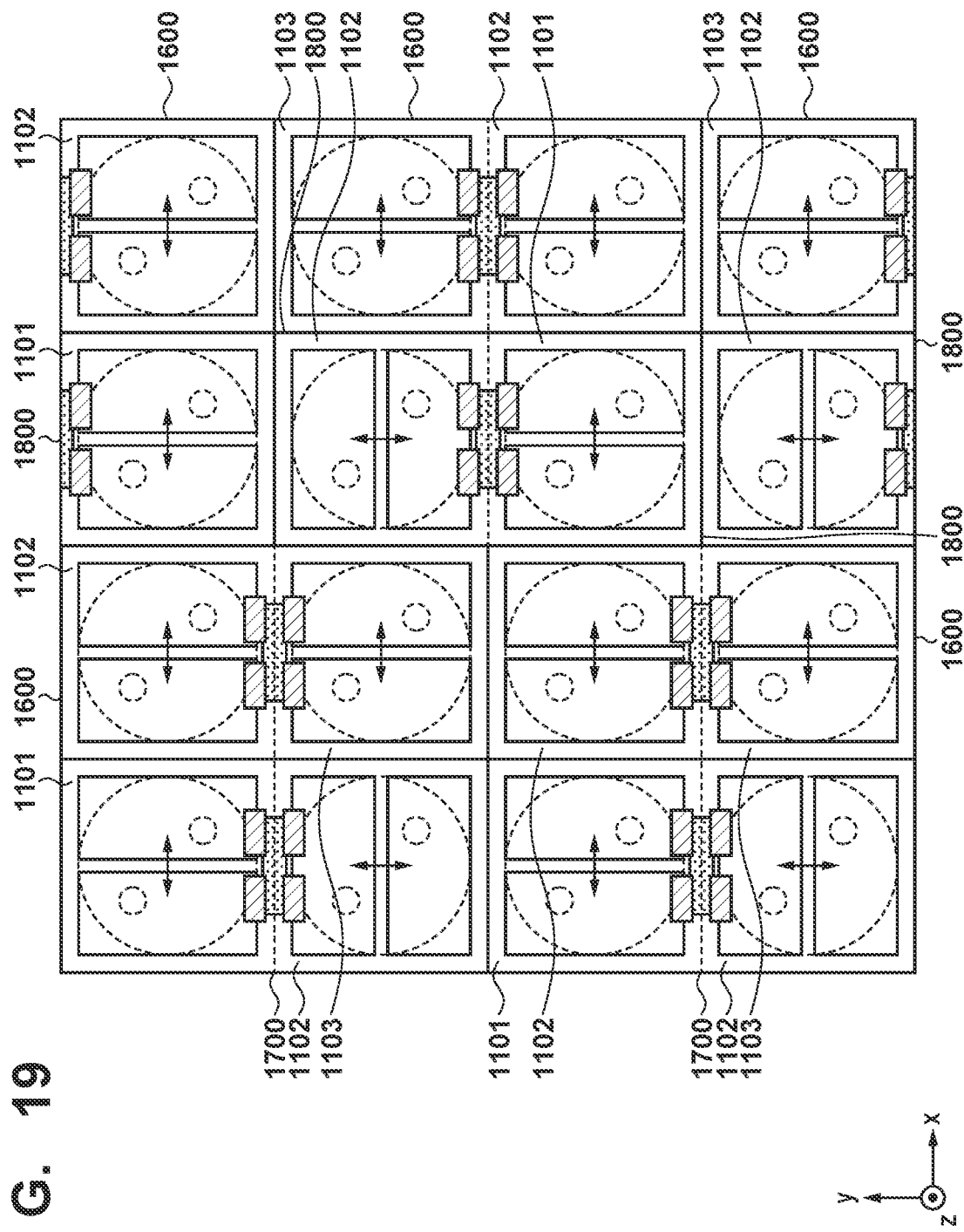
FIG. 19 is a diagram schematically showing a pixel array in the second embodiment in a range of 4 rows×4 columns.

FIG. 19 is a schematic diagram showing the pixel layout of the pixel array 101 in the range of 4 rows×4 columns in the second embodiment. By laying out a large number of sets of pixels of 4 rows×4 columns shown in FIG. 19 on a plane, the imaging signal and the phase difference signals can be acquired. In FIG. 19, the ML 301, sensitivity regions 1611, 1612, 1614 and 1614, N-type connecting regions 1621, 1622, 1623 and 1624, gate electrodes 1631, 1632, 1633 and 1634, FD 205, division directions of phase difference signals, and color filter 406 are shown. As the color filter 406, CFR 1101, CFG 1102 and CFB 1103, arranged in a Bayer array, are shown.

Further, in the example shown in FIG. 19, the pixel sets 1700 are laid out in the first column from the left, the pixel sets 1600 are laid out in the second column, the pixel sets 1800 are laid out in the third column, and the pixel sets 1600 are laid out in the fourth column. Further, in the third and fourth columns, the pixel sets are laid out so as to be shifted by one pixel in the y direction with respect to the pixel sets in the first and second rows.

By laying out the pixel sets in this way, phase difference signals whose pupil division direction is the x direction can be acquired from pixels covered from the CFR 1101 (R pixels), pixels covered by the CFB 1103 (B pixels), and pixels covered by the CFG 1102 (Gr pixels) which are laid out in the same row as the pixels covered by the CFR 1101. Further, from the pixels (Gb pixels) covered by the CFG 1102 laid out in the same row as the pixels covered by the CFB 1103 (B pixels), the phase difference signals whose pupil division direction is the y direction can be acquired.

Here, the characteristics of the Gb pixels laid out in the first column and the Gb pixels laid out in the third column will be described.

The Gb pixels laid out in the first column are the pixels 105D of the pixel sets 1700, and charge converted from the light incident on the sensitivity regions 1613 having a larger y coordinate is accumulated in the accumulation regions 1603 and charge converted from the light incident on the sensitivity regions 1614 having a smaller y coordinate is accumulated in the accumulation regions 1604. Here, the accumulation region 1603 in the pixel set 1700 is type 1 and adjacent to both the recessed region 404 and the notched region 405 of the P-type semiconductor, and the accumulation region 1604 is type 2 and adjacent only to the notched region 405 of the P-type semiconductor.

The Gb pixels laid out in the third column are the pixels 105U of the pixel sets 1800, and charge converted from the light incident on the sensitivity regions 1611 having a larger y coordinate is accumulated in the accumulation regions 1601 and charge converted from the light incident on the sensitivity regions 1612 having a smaller y coordinate is accumulated in the accumulation regions 1602. Here, the accumulation region 1601 in the pixel set 1800 is type 2, and the accumulation region 1603 is type 1.

Since the volume of the N-type region of the accumulation region of type 1 is smaller than that of the accumulation region of type 2, the amount of signal charge that can be stored in the accumulation region of type 1 may be smaller. That is, in the Gb pixels laid out in the first column, the saturation charge amounts of the sensitivity regions whose y coordinates are smaller are larger than the saturation charge amounts of the sensitivity regions whose y coordinates are larger. On the other hand, in the Gb pixels laid out in the third column, the saturation charge amounts of the sensitivity regions whose y coordinates are larger are larger than the saturation charge amounts of the sensitivity regions whose y coordinates are smaller.

Therefore, as shown in FIG. 19, by alternately laying out the Gb pixels (first column) in which saturation charge amounts of the sensitivity regions whose y coordinates are smaller are larger than the sensitivity regions whose y coordinates are larger, and the Gb pixels (third column) in which saturation charge amounts of the sensitivity regions whose y coordinates are larger are larger than the sensitivity regions whose y coordinates are smaller every two columns, it is possible to acquire non-saturated signals both in a case where a larger amount of light is incident on the sensitivity regions whose y coordinates are larger than the other sensitivity regions in the Gb pixels and in a case where a larger amount of light is incident on the sensitivity regions whose y coordinates are smaller than the other sensitivity regions in the Gb pixels. That is, the saturation charge amounts of the phase difference signals from the pupil division pixels divided in the vertical direction can be made even.

As described above, according to the second embodiment, the same effect as that of the first embodiment can be obtained even with the configuration in which the readout circuit is shared by two pixels.

Third Embodiment

Next, a third embodiment of the present invention will be described.

Figure 20:
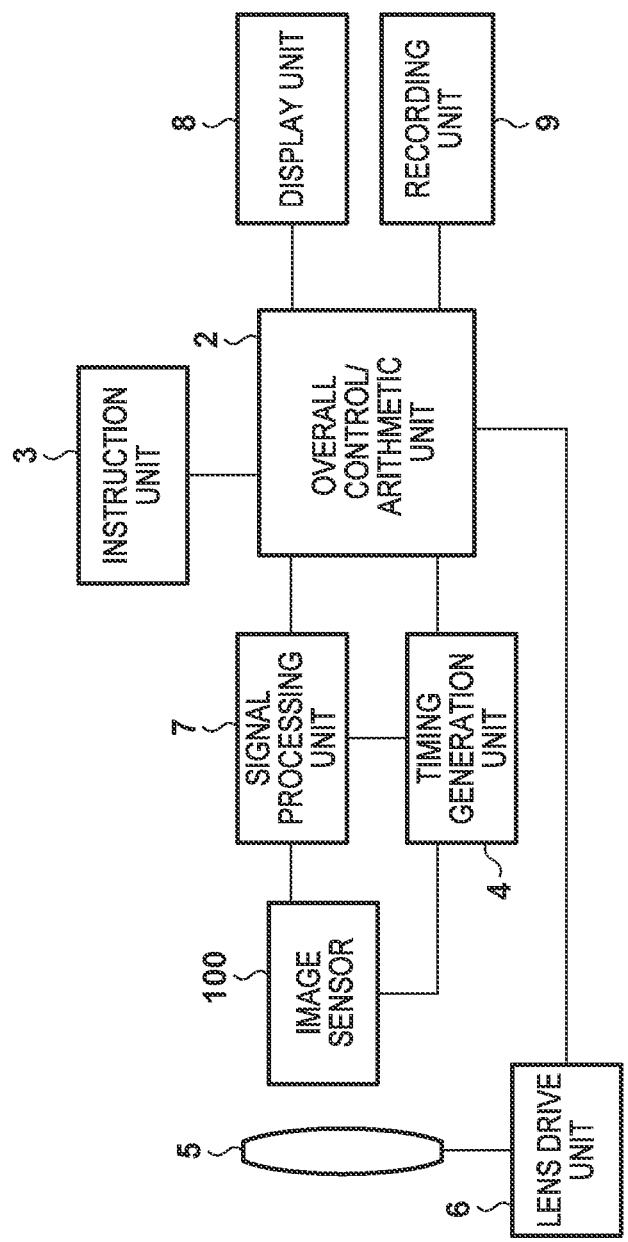
FIG. 20 is a block diagram showing a schematic configuration of an image capturing apparatus according to a third embodiment.

FIG. 20 is a block diagram showing a schematic configuration of an image capturing apparatus according to the third embodiment of the present invention. The image capturing apparatus of the present embodiment includes an image sensor 100 having the configuration as described above, an overall control/arithmetic unit 2, an instruction unit 3, a timing generation unit 4, an imaging lens unit 5, a lens drive unit 6, a signal processing unit 7, a display unit 8 and a recording unit 9.

The imaging lens unit 5 forms an optical image of a subject on the image sensor 100. Although it is represented by one lens in the figure, the imaging lens unit 5 may include a plurality of lenses including a focus lens, a zoom lens, and a diaphragm, and may be detachable from the main body of the image capturing apparatus or may be integrally configured with the main body.

The image sensor 100 has the configuration as described in the above embodiments, and converts the light incident through the imaging lens unit 5 into an electric signal and outputs it. Signals are read out from each pixel of the image sensor 100 so that pupil division signals that can be used in phase difference focus detection and an imaging signal that is a signal of each pixel can be acquired.

The signal processing unit 7 performs predetermined signal processing such as correction processing on the signals output from the image sensor 100, and outputs the pupil division signals used for focus detection and the imaging signal used for recording.

The overall control/arithmetic unit 2 comprehensively drives and controls the entire image capturing apparatus. In addition, the overall control/arithmetic unit 2 also performs calculations for focus detection using the pupil division signals processed by signal processing unit 7, and performs arithmetic processing for exposure control, and predetermined signal processing, such as development for generating images for recording/playback and compression, on the image signal.

The lens drive unit 6 drives the imaging lens unit 5, and performs focus control, zoom control, aperture control, and the like on the imaging lens unit 5 according to control signals from the overall control/arithmetic unit 2.

The instruction unit 3 accepts inputs such as shooting execution instructions, drive mode settings for the image capturing apparatus, and other various settings and selections that are input from the outside by the operation of the user, for example, and sends them to the overall control/arithmetic unit 2.

The timing generation unit 4 generates a timing signal for driving the image sensor 100 and the signal processing unit 7 according to a control signal from the overall control/arithmetic unit 2.

The display unit 8 displays a preview image, a playback image, and information such as the drive mode settings of the image capturing apparatus.

The recording unit 9 is provided with a recording medium (not shown), and an imaging signal for recording is recorded. Examples of the recording medium include semiconductor memories such as flash memory. The recording medium may be detachable from the recording unit 9 or may be built-in.

Next, an arithmetic method for calculating a defocus amount from the pupil division signals in the overall control/arithmetic unit 2 will be described.

First, the phase difference focus detection in the x direction in the present embodiment will be described with reference to FIGS. 21 to 27.

Figure 21:
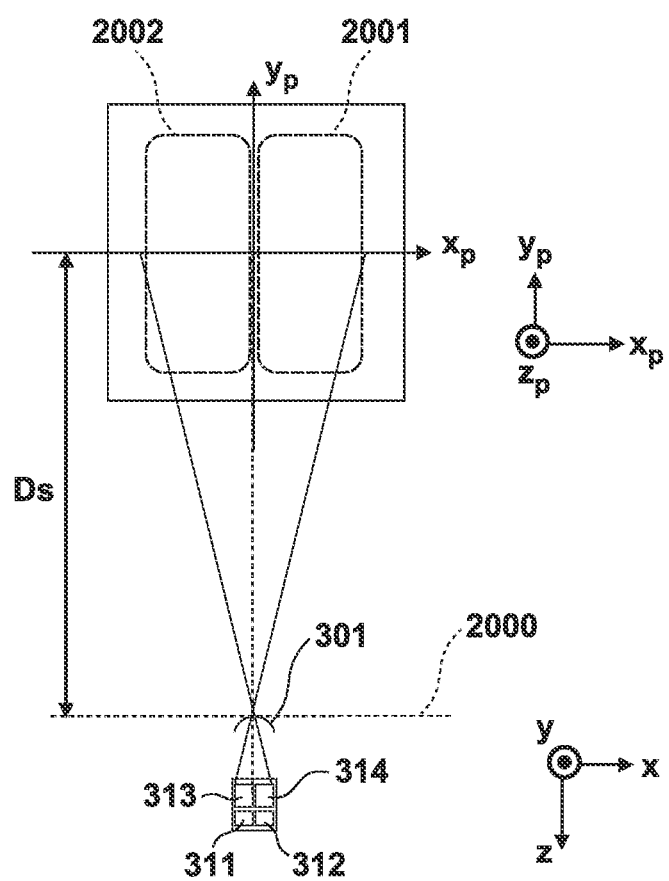
FIG. 21 is a diagram showing a relationship between a pixel divided in the x direction and a partial pupil region according to the third embodiment.

FIG. 21 is a cross-sectional view of the pixel 700 or pixel 900 taken along the line A-A' shown in FIG. 3 whose pupil division direction is the x direction, and a pupil plane at the position separated from an imaging plane 2000 of the image sensor 100 by a distance Ds in the negative direction of the z-axis. In FIG. 21, x, y, and z indicate the coordinate axes on the imaging plane 2000, and $x_p$, $y_p$, and $z_p$ indicate the coordinate axes on the pupil plane.

Figure 22:
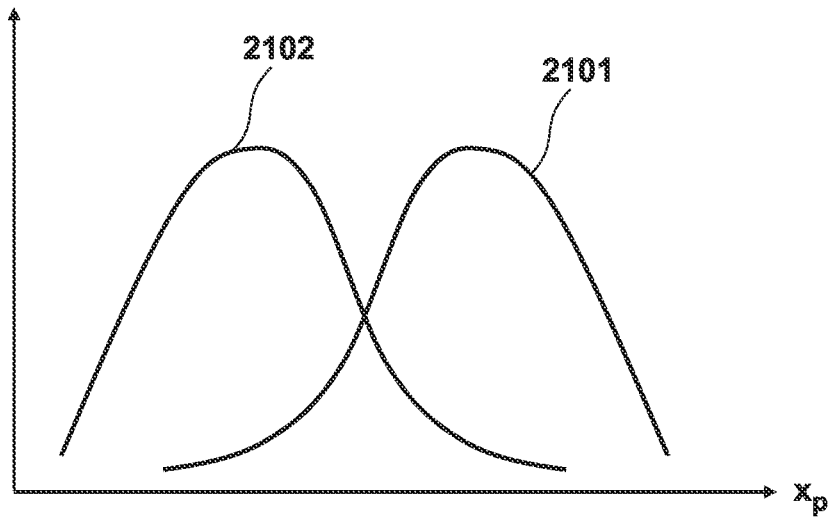
FIG. 22 is a conceptual diagram showing an example of a pupil intensity distribution in a partial pupil region according to the third embodiment.

The pupil plane and the light receiving surface (second surface) of the image sensor 100 have substantially conjugated relationship via the ML 301. Therefore, the luminous flux that has passed through a partial pupil region 2001 is received in the sensitivity region 313 or the accumulation region 311. Further, the luminous flux that has passed through a partial pupil region 2002 is received in the sensitivity region 314 or the accumulation region 312. The signal charge photoelectrically converted near the boundary between the sensitivity region 313 and the sensitivity region 314 is stochastically transported to the accumulation region 311 or the accumulation region 312. Therefore, at the boundary between the partial pupil region 2001 and the partial pupil region 2002, the signals are gradually switched as the x coordinate becomes larger, and the x direction dependencies of the pupil intensity distributions have shapes as illustrated in FIG. 22. Hereinafter, the pupil intensity distribution corresponding to the sensitivity region 313 and the accumulation region 311 is referred to as a first pupil intensity distribution 2101, and the pupil intensity distribution corresponding to the sensitivity region 314 and the accumulation region 312 is referred to as a second pupil intensity distribution 2102.

Figure 23:
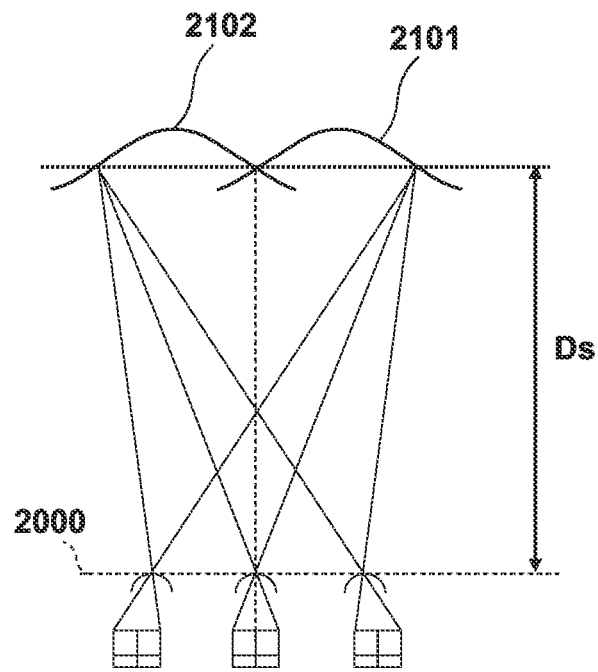
FIG. 23 is a diagram illustrating a sensor entrance pupil of an image sensor according to the third embodiment.

Next, with reference to FIG. 23, a sensor entrance pupil of the image sensor 100 will be described. In the image sensor 100 of the present embodiment, the MLs 301 of respective pixels are continuously shifted toward the center of the image sensor 100 depending on the image height coordinates of the pixels on the two-dimensional plane. That is, each ML 301 is arranged so as to be more eccentric toward the center as the image height of the pixel becomes higher. The center of the image sensor 100 and the optical axis of the imaging optical system change depending on the mechanism that reduces the influence of blurring due to camera shake or the like by driving the imaging optical system or the image sensor 100, but they are substantially the same. As a result, in the pupil plane located at a distance Ds from the image sensor 100, the first pupil intensity distribution 2101 and the second pupil intensity distribution 2102 of each pixel 700 or pixel 900 arranged at each image height coordinate of the image sensor 100 substantially match. That is, in the pupil plane located at the distance Ds from the image sensor 100, the first pupil intensity distribution 2101 and the second pupil intensity distribution 2102 of all the pixels of the image sensor 100 substantially match.

Hereinafter, the first pupil intensity distribution 2101 and the second pupil intensity distribution 2102 are referred to as the "sensor entrance pupil" of the image sensor 100, and the distance Ds is referred to as the "sensor pupil distance" of the image sensor 100. It is not necessary to configure all the pixels to have the same sensor pupil distance. For example, the sensor pupil distances of pixels up to 80% of the image height may be substantially the same, or pixels may be configured to have different sensor pupil distances by each row or by each detection area.

FIG. 24 shows a schematic relationship diagram between an image shift amount and a defocus amount between parallax images. The image sensor 100 (not shown) of the present embodiment is aligned on the imaging plane 2000, and the exit pupil of the imaging optical system is divided into the partial pupil region 2001 and the partial pupil region 2002 as in FIG. 21.

For a defocus amount d, the distance from the imaging position of the subject to the imaging plane is given by |d|, the front focused state in which the imaging position of the subject is closer to the subject than the imaging plane is expressed by negative (d<0), and the rear focused state in which the imaging position of the subject is on the opposite side of the subject with respect to the imaging plane is expressed by positive (d>0). The in-focus state in which the imaging position of the subject is on the imaging plane is expressed as d=0. FIG. 24 shows an example in which a subject on an object plane 2301 is in the in-focus state (d=0) and a subject on an object plane 2302 is in the front focused state (d<0). The front focused state (d<0) and the rear focused state (d>0) are both referred to as a defocus state (|d|>0).

In the front focused state (d<0), among the luminous fluxes from the subject on the object plane 2302, the luminous flux that has passed through the partial pupil region 2001 (2002) converges once and then diverges to have the radius Γ1 (Γ2) about the position G1 (G2) as the center of gravity of the luminous flux, and formed as a blurred image on the imaging plane 2000. The blurred image is received by the sensitivity region 313 and the accumulation region 311, and the sensitivity region 314 and the accumulation region 312, and parallax images are generated. Therefore, the generated parallax images are blurred images of the subject with the images of the subject on the object plane 2302 is spread to have the radius Γ1 (Γ2) about the position G1 (G2) of the center of gravity.

The radius Γ1 (Γ2) of blur of the subject image generally increases proportionally as the magnitude |d| of the defocus amount d increases. Similarly, the magnitude |p| of an image shift amount p (=G2−G1) between the subject images of the parallax images also increases approximately proportionally as the magnitude |d| of the defocus amount d increases. The same relationship is held in the rear focused state (d>0), although the image shift direction of the subject images between the parallax images is opposite to that in the front focused state. In the in-focus state (d=0), the positions of the centers of gravity of the subject images in the parallax images are the same (p=0), and no image shift occurs.

Therefore, with regard to the two phase difference signals obtained by using the signals from the sensitivity region 313 and accumulation region 311, and the signals from the sensitivity region 314 and accumulation region 312, as the magnitude of the defocus amount of the parallax images increases, the magnitude of the image shift amount between the two phase difference signals in the x direction increases.

Based on this relationship, the phase difference focus detection is performed by converting the image shift amount calculated by performing correlation operation on the image shift amount between the parallax images in the x-direction into the defocus amount. A conversion coefficient used at this time is referred to as a conversion coefficient Kx.

Figures 25A, 25B, 25C:
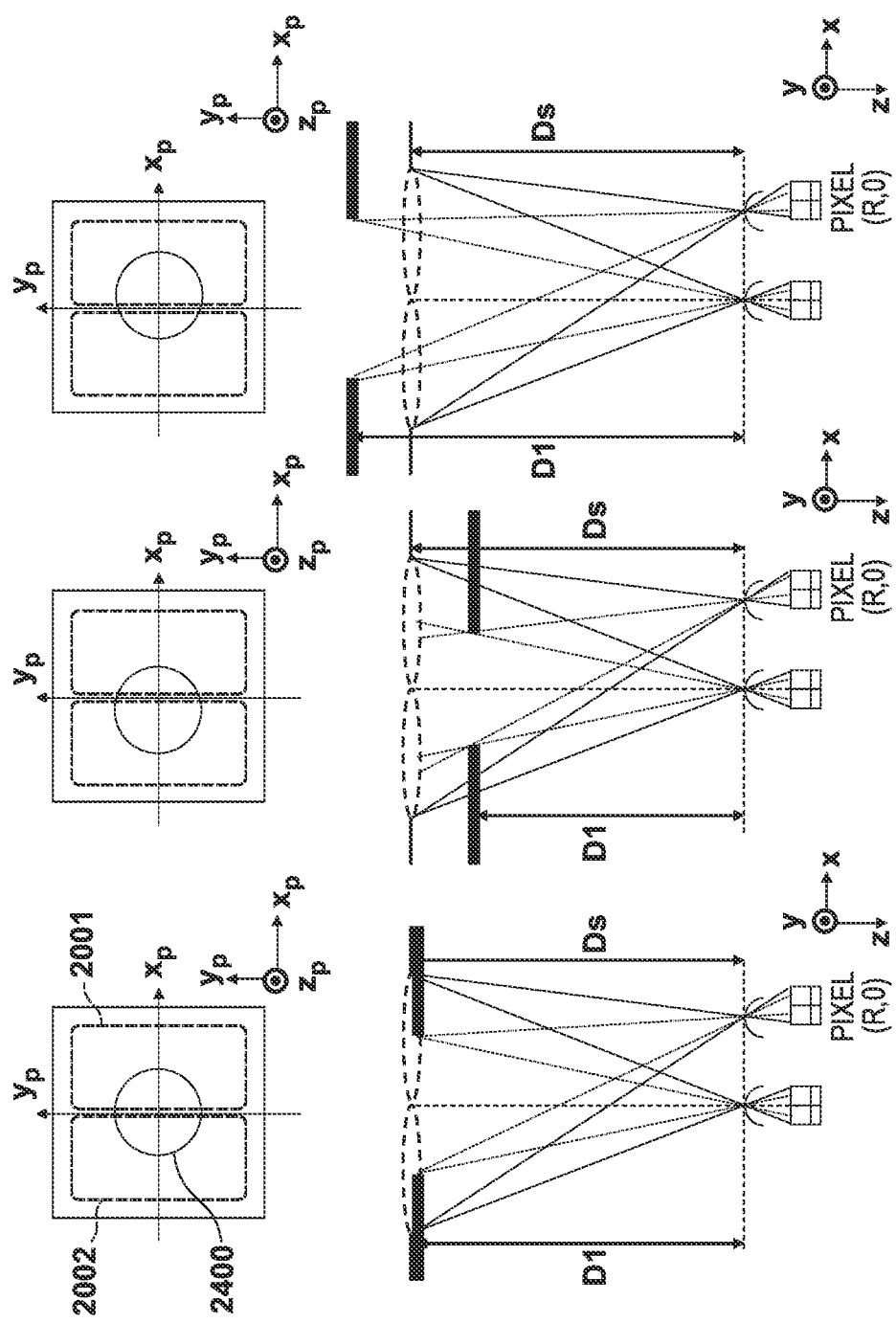
FIGS. 25A to 25C are diagrams showing relationships between partial pupil regions with respect to a pixel located at a peripheral image height in the x direction of the image sensor and an exit pupil of an imaging optical system according to the third embodiment.
Figure 26A:
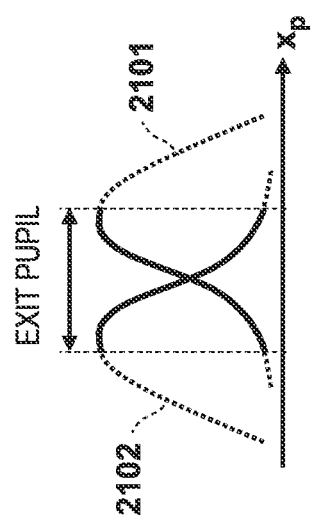
FIGS. 26A to 26C are diagrams showing relationships of x-direction dependency between an exit pupil and pupil intensity distribution in each state shown in FIGS. 25A to 25C according to the third embodiment.
Figure 26B:
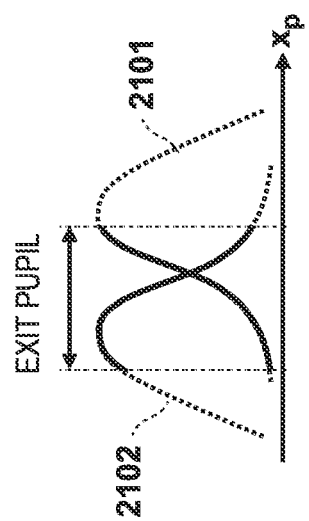
Figure 26C:
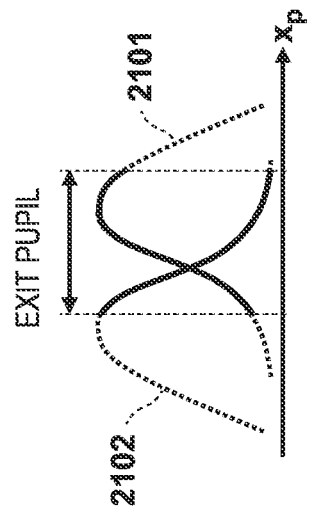

Next, the relationship between the conversion coefficient Kx and shift of pupil will be described. FIGS. 25A to 25C show relationships between the partial pupil regions 2001 and 2002 in the pixels 700 or 900 located at a peripheral image height (R, 0) of the image sensor 100 and the exit pupil 2400 of the imaging optical system. Further, FIGS. 26A to 26C show relationships of x-direction dependency between the exit pupil and the pupil intensity distribution. Of the x-direction dependency of the pupil intensity distribution, the region inside the exit pupil is shown by solid lines, and the region outside the exit pupil is shown by broken lines. The position (R, 0) of the pixel 700 or the pixel 900 in the pixel array is a position shifted in the x-plus direction from the center of the optical axis, as shown in FIG. 27.

FIG. 25A shows a case where an exit pupil distance D1 of the imaging optical system and the sensor pupil distance Ds of the image sensor 100 are the same. In this case, the pupil is divided into the first partial pupil region 2001 and the second partial pupil region 2002 near the center of an exit pupil 2400 of the imaging optical system. In this case, the range of light flux to be received spreads to the same extent in the plus and minus directions from the x coordinate where the signal intensities of the first pupil intensity distribution 2101 and the second pupil intensity distribution 2102 intersect. As a result, the relationship between the pupil intensity distribution and the exit pupil is as shown in FIG. 26A.

On the other hand, as shown in FIG. 25B, when the exit pupil distance D1 of the imaging optical system is shorter than the sensor pupil distance Ds of the image sensor 100, the pupil deviation occurs between the exit pupil of the imaging optical system and the entrance pupil of the sensor 100 at the peripheral image height of the image sensor 100, and as a result, the exit pupil 2400 of the imaging optical system is unevenly divided, and the relationship between the pupil intensity distribution and the exit pupil is as shown in FIG. 26B.

Similarly, as shown in FIG. 25C, when the exit pupil distance D1 of the imaging optical system is longer than the sensor pupil distance Ds of the image sensor 100, the pupil deviation occurs between the exit pupil of the imaging optical system and the entrance pupil of the sensor 100 at the peripheral image height of the image sensor 100, and as a result, the exit pupil 2400 of the imaging optical system is unevenly divided, and the relationship between the pupil intensity distribution and the exit pupil is as shown in FIG. 26C.

As shown in FIGS. 25A to 25C, the region of the pupil intensity distribution included in the exit pupil differs depending on the exit pupil distance D1. Therefore, the conversion coefficient Kx, which represents the relationship between the magnitude of the defocus amount and the magnitude of the image shift amount in the x direction between the phase difference signals, has different values depending on the exit pupil distance and the image height.

Next, with reference to FIGS. 28 to 32C, the phase difference focus detection in a case where the pupil division direction is the y direction will be described. The description of the part which is the same as that of the phase difference focus detection in the x direction will be omitted, and the difference will be explained. In the phase difference focus detection in the y direction, the image shift amount in the y direction is calculated from the phase difference signals of the pixels 800 or pixels 1000 whose pupil division direction is the y direction, and the image shift amount is converted into a defocus amount using a conversion coefficient Ky.

Figure 28:
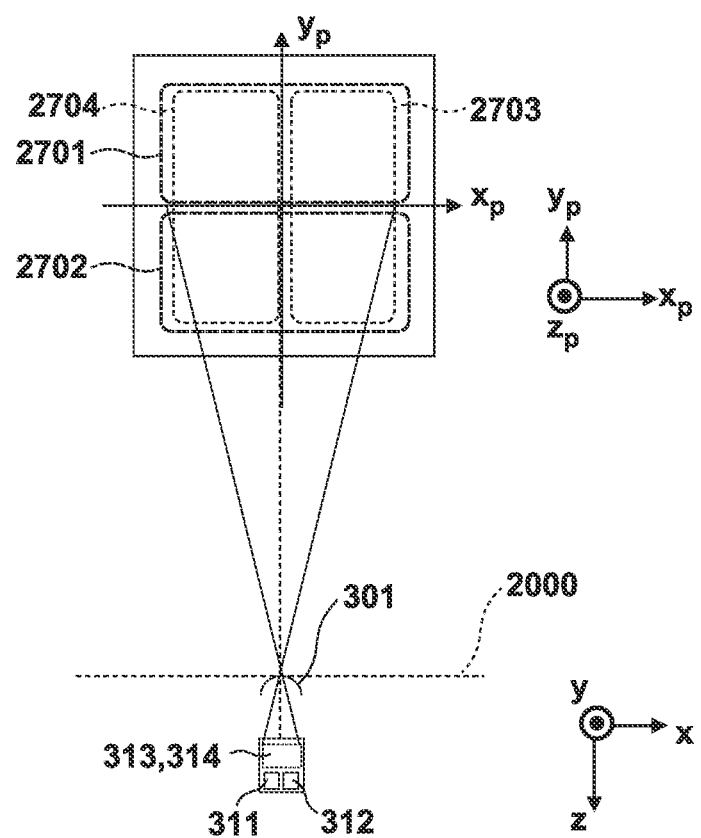
FIG. 28 is a diagram showing a relationship between a pixel divided in the y direction and a partial pupil region according to the third embodiment.

FIG. 28 shows a cross-sectional view of the pixel 800 or 1000 in which the pupil division direction of the sensitivity region is the y direction, and a pupil plane at a position separated by the sensor pupil distance Ds in the negative z-axis direction from the imaging plane 2000 of the image sensor 100. In FIG. 28, x, y, and z indicate the coordinate axes on the imaging plane 2000, and $x_p$, $y_p$, and $z_p$ indicate the coordinate axes on the pupil plane.

The pupil plane and the light receiving surface (second surface) of the image sensor 100 have a substantially conjugated relationship via the ML 301. Therefore, the luminous flux that has passed through a partial pupil region 2701 is received in the sensitivity region 313, and the luminous flux that has passed through a partial pupil region 2702 is received in the sensitivity region 311. Further, the luminous flux that has passed through a partial pupil region 2703 is received in the accumulation region 311, and the luminous flux that has passed through a partial pupil region 2704 is received in the accumulation region 312. The proportion of the luminous flux received in the sensitivity regions 313 and 314 and the proportion of the luminous flux received in the accumulation regions 311 and 312 are determined mostly by the wavelength of the received light.

Figures 29A, 29B, 29C:
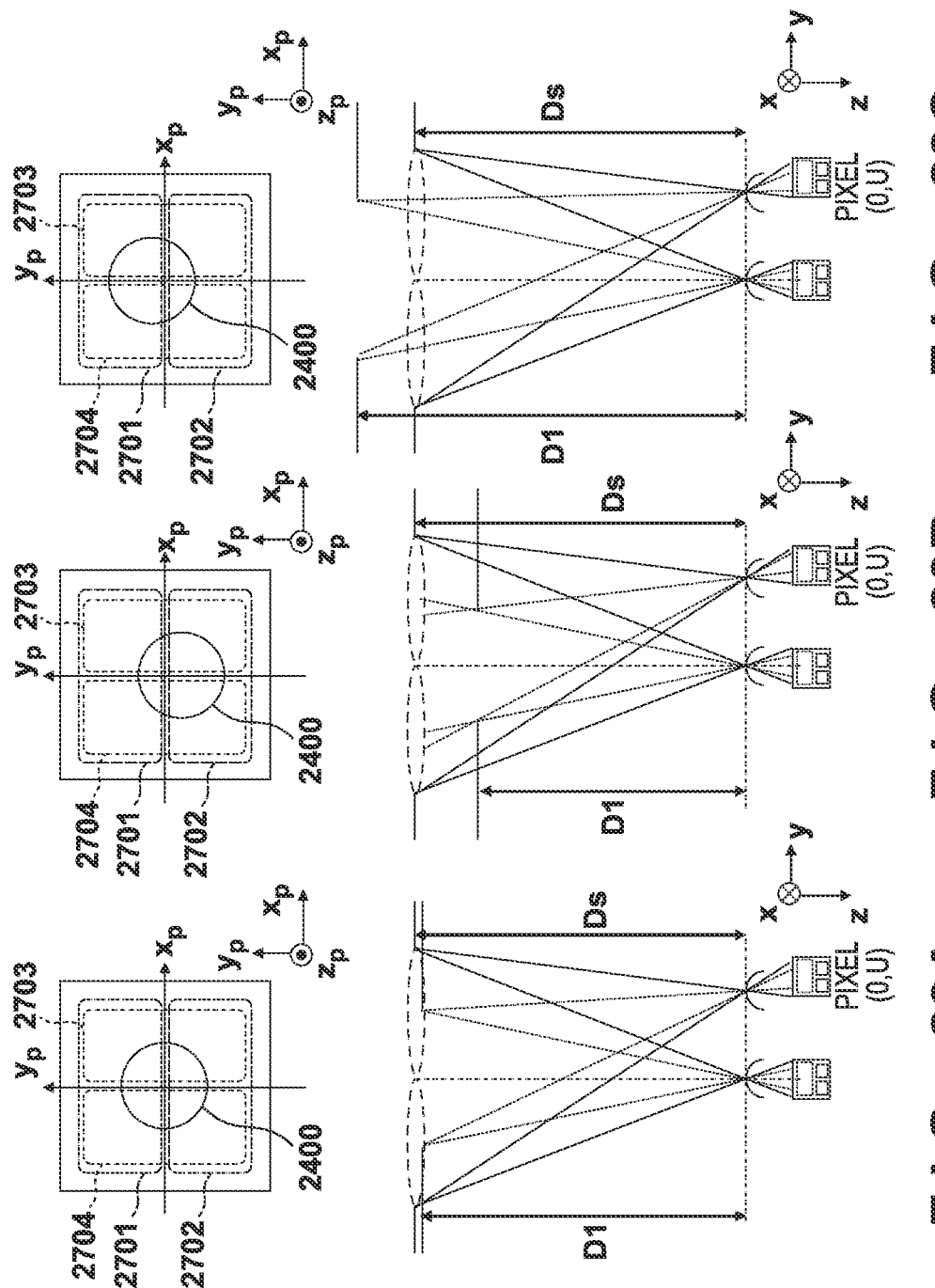
FIGS. 29A to 29C are diagrams showing relationships between partial pupil regions with respect to a pixel located at peripheral image height in the y direction of the image sensor and an exit pupil of the imaging optical system according to the third embodiment.
Figure 30A:
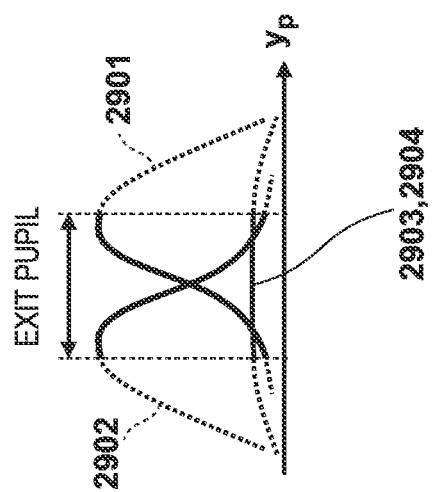
FIGS. 30A to 30C are diagrams showing relationships of y-direction dependency between an exit pupil and pupil intensity distribution in each state shown in FIGS. 29A to 29C according to the third embodiment.
Figure 30B:
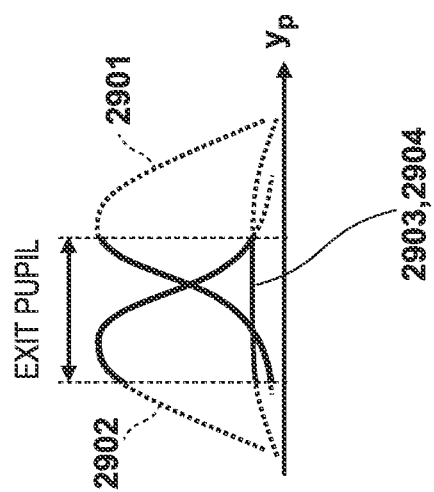
Figure 30C:
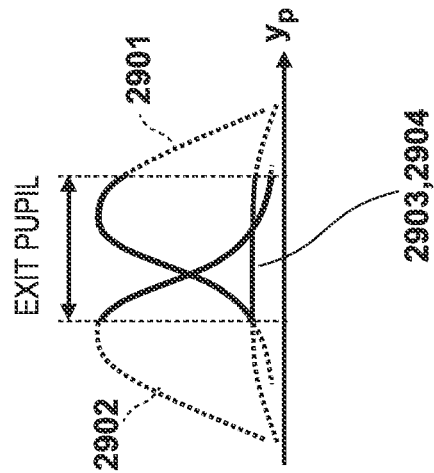

Next, the relationship between shift of pupil and the conversion coefficient Ky which represents the relationship between the image shift amount between parallax images at the time of detecting phase difference in the y direction and the defocus amount will be described. FIGS. 29A to 29C show relationships between the partial pupil regions 2701 to 2704 in the pixel 800 or 1000 located at a peripheral image height (0, U) of the image sensor 100 and the exit pupil 2400 of the imaging optical system. Further, FIGS. 30A to 30C show relationships of y-direction dependency between the exit pupil and the pupil intensity distribution. The position (0, U) of the pixel 800 or the pixel 1000 in the pixel array is a position shifted in the y-plus direction from the center of the optical axis, as shown in FIG. 27.

FIG. 29A shows a case where the exit pupil distance D1 of the imaging optical system and the sensor pupil distance Ds of the image sensor 100 are the same. In this case, the light flux to be received in the sensitivity regions 313 and 314 divides the exit pupil in the y direction near the center of the exit pupil 2400 of the imaging optical system. Accordingly, the y direction dependency between the third pupil intensity distribution 2901 that corresponds to the sensitivity region 313 and the fourth pupil intensity distribution 2902 that corresponds to the sensitivity region 314 in a pixel whose pupil division direction is the y direction is as shown in FIG. 30A.

Further, the light received in the accumulation regions 311 and 312 is not divided in the y direction, which is the direction for calculating the image shift amount, and the light amounts are substantially the same. Accordingly, the y direction dependency between a third pupil intensity distribution 2901 that corresponds to the sensitivity region 313 and a fourth pupil intensity distribution 2902 that corresponds to the sensitivity region 314 in a pixel whose pupil division direction is the y direction is as shown in FIG. 30A.

In the pixel 800, the sensitivity region 313 and the accumulation region 311, and the sensitivity region 314 and the accumulation region 312 are respectively connected via the N-type connection regions, and in the pixel 1000, the sensitivity region 313 and the accumulation region 312, and the sensitivity region 314 and the accumulation region 311 are respectively connected via the N-type connection regions. Therefore, in the pixel 800, a signal corresponding to the combination of the third pupil intensity distribution 2901 and the fifth pupil intensity distribution 2903 and a signal corresponding to the combination of the fourth pupil intensity distribution 2902 and the sixth pupil intensity distribution 2904 are output as phase difference signals.

On the other hand, in the pixel 1000, a signal corresponding to the combination of the third pupil intensity distribution 2901 and the sixth pupil intensity distribution 2904 and a signal corresponding to the combination of the fourth pupil intensity distribution 2902 and the fifth pupil intensity distribution 2903 are output as phase difference signals. Since the fifth pupil intensity distribution 2903 and the sixth pupil intensity distribution 2904 are substantially constant with respect to the y direction and have substantially the same signal amount, the phase difference signals obtained from the pixel 800 and the pixel 1000 are substantially the same. Therefore, the positions of the centers of gravity of the pixel 800 and the pixel 1000 are equal in the y direction, and the conversion coefficients Ky, which represents the relationship between the magnitude of the defocus amount and the image shift amount in the y direction for the pixel 800 and the pixel 1000 have approximately the same value. That is, the signals obtained from the accumulation regions 311 and 312 that do not divide the pupils in the y direction are added as offset components to the signals obtained from the sensitivity regions 313 and 314 that divide the exit pupils in the y direction, however, since the offset amounts are equal, the conversion coefficient Ky does not change even if the combinations of the signals to be added from the sensitivity regions and the accumulation regions whose signals are different between the pixels 800 and 1000.

FIGS. 29B and 29C and FIGS. 30B and 30C show cases where the exit pupil distance D1 of the imaging optical system is shorter or longer than the sensor pupil distance Ds in the pixel 800 or the pixel 1000 at the position (0, U). In this case, the relationship between the third pupil intensity distribution 2901 and the fourth pupil intensity distribution 2902 and the exit pupil is the same as a case where the pupil division direction is the x direction. Further, the fifth pupil intensity distribution 2903 and the sixth pupil intensity distribution 2904 are the same as those in the cases of FIGS. 29A and 30A, and the signal amounts are substantially constant with respect to the y direction and substantially equal. Therefore, the conversion coefficient Ky takes the same value for the pixel 800 and the pixel 1000.

Next, with reference to FIGS. 31A to 32C, in the phase difference detection in a case where the pupil division direction is the y direction, the pixel position in the pixel array is at a position (R, U) that is shifted from the optical axis in the x-plus direction and the y-plus direction will be described. As shown in FIG. 27, the pixel position (R, U) in the pixel array is the position shifted by R in the x-plus direction and by U in the y-plus direction from the optical axis.

Figures 31A, 31B, 31C:
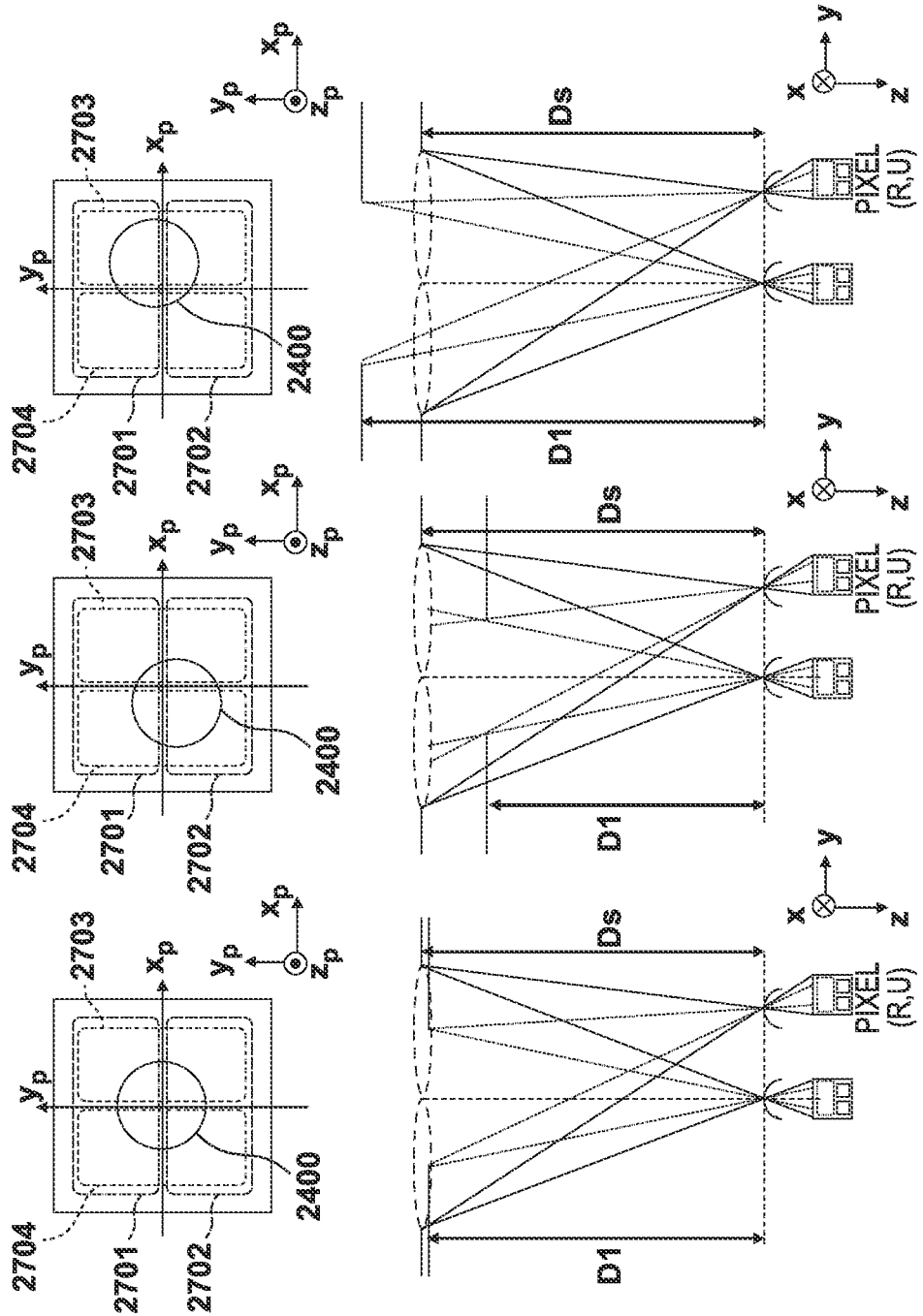
FIGS. 31A to 31C are diagrams showing relationships between partial pupil regions with respect to a pixel located at peripheral image height in the x and y directions of the image sensor and an exit pupil of the imaging optical system according to the third embodiment.
Figure 32A:
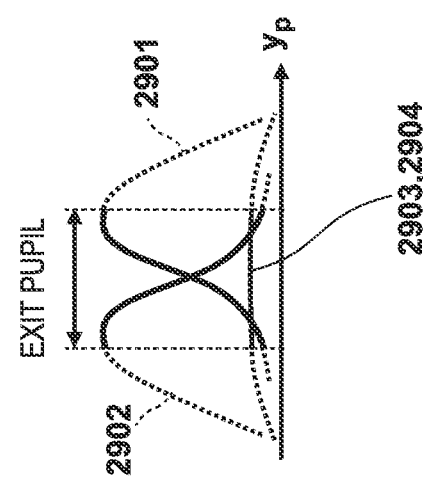
FIGS. 32A to 32C are diagrams showing relationships of x-direction dependency and y-direction dependency between an exit pupil and pupil intensity distribution in each state shown in FIGS. 31A to 31C according to the third embodiment.

FIG. 31A shows a case where the exit pupil distance D1 of the imaging optical system and the sensor pupil distance Ds of the image sensor are the same. In this case, as in the case of the pixel 800 or the pixel 1000 at the position (0, U), since the third pupil intensity distribution 2901 and the fourth pupil intensity distribution 2902 divide the vicinity of the center of the exit pupil 2400 of the imaging optical system and the fifth pupil intensity distribution 2903 and the sixth pupil intensity distribution 2904 are not divided in the y direction and have substantially the same amount of light, and distributions are as shown in FIG. 32A.

Figure 32B:
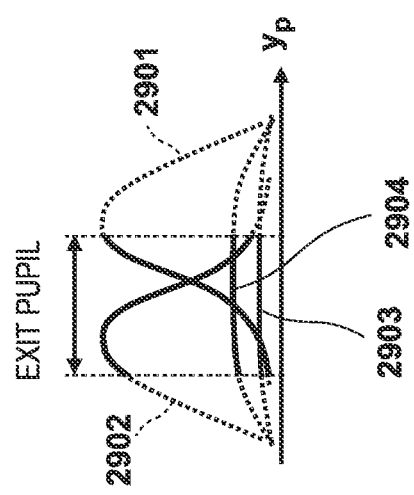

FIG. 31B shows a relationship between the partial pupil regions 2701 to 2704 and the exit pupil distance D1 of the imaging optical system in a case where the exit pupil distance D1 of the imaging optical system is shorter than the sensor pupil distance Ds of the image sensor 100. Since the exit pupil 2400 is divided to the partial pupil region 2701 corresponding to the sensitivity region 313 and the partial pupil region 2702 corresponding to the sensitivity region 314 in the same manner as in the case of the pixel 800 or the pixel 1000 at the position (0, U), the y-direction dependency of the third pupil intensity distribution 2901 and the fourth pupil intensity distribution 2902 is almost the same as that of the pixel 800 or the pixel 1000 located at the position (0, U), and have characteristics as shown in FIG. 32B.

On the other hand, since the partial pupil region 2703 and the partial pupil region 2704 are not divided in the y direction, the fifth pupil intensity distribution 2903 and the sixth pupil intensity distribution 2904 do not have the y-direction dependency. However, since the amount of light passing through the the pupil region 2703 is less than the pupil region 2704, the fifth pupil intensity distribution 2903 is smaller than the sixth pupil intensity distribution 2904, and have characteristics as shown in FIG. 32B.

Similarly, the relationship between the partial pupil regions 2701 to 2704 and the exit pupil distance D1 of the imaging optical system in a case where the exit pupil distance D1 of the imaging optical system is longer than the sensor pupil distance Ds of the image sensor 100 is as shown in FIG. 31C. In this case, the y-direction dependency of the third pupil intensity distribution 2901 and the fourth pupil intensity distribution 2902 is almost the same as that of the pixel 800 or the pixel 1000 located at the position (0, U).

Figure 32C:
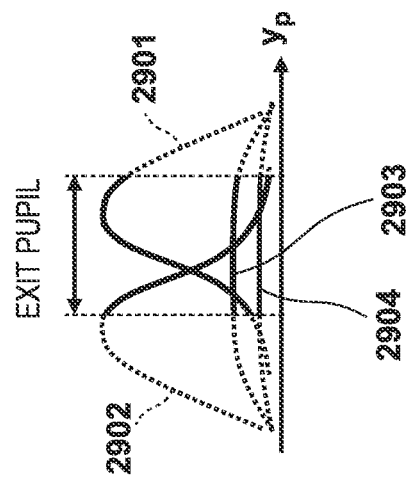

On the other hand, since the amount of light passing through the partial pupil region 2704 is less than that passing through the partial pupil region 2703, the sixth pupil intensity distribution 2904 is smaller than the fifth pupil intensity distribution 2903, and have characteristics as shown in FIG. 32C. In this case, the offset components added to the sensitivity regions 313 and 314 that divide the exit pupil in the Y direction are different between the pixels 800 and the pixels 1000. Therefore, the conversion coefficient Ky takes different values between the pixel 800 and the pixel 1000.

Therefore, in the phase difference focus detection in the y direction, a more accurate defocus amount can be calculated by calculating the image shift amount from the phase difference signals obtained from the pixels 800 and the pixel 1000, and by calculating the defocus amount using different conversion coefficients Ky.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-135071, filed on Aug. 7, 2020, No. 2021-096751, filed on Jun. 9, 2021, and No. 2021-119009, filed on Jul. 19, 2021, which are hereby incorporated by reference herein in their entirety.

What is claimed is:

1. An image sensor comprising:
a plurality of microlenses; and
a pixel array having, with respect to each of the microlenses,
a pair of first regions formed at a first depth from a surface on which light is incident,
a pair of second regions formed at a second depth deeper than the first depth,
a plurality of connecting regions that connects the pair of first regions and the pair of second regions, respectively,
a conversion unit that converts charge into voltage, and
a transfer unit, which is connected to each of the second regions, that transfers the charge accumulated in the second regions to the conversion unit,
wherein a direction of arranging the pair of second regions corresponding to each microlens is a first direction, and a direction of arranging the pair of first regions is either the first direction or a second direction which is orthogonal to the first direction,
wherein the first regions generate charge by performing photoelectric conversion on incident light, and the second regions accumulate the charge generated in the first regions via the connecting regions,
wherein a length of each of the second regions in the depth direction in a first partial region of the second regions is shorter than a length of the second region in the depth direction in a second partial region of the second region, or an impurity concentration in the first partial region is lower than an impurity concentration in the second partial region,
wherein the first partial region is located farther from the transfer unit than the second partial region, and
wherein the conversion unit and the transfer unit are implemented by one or more processors, circuitry or a combination thereof.

2. The image sensor according to claim 1, wherein the length of the second partial region in the depth direction is shorter in areas corresponding to the connecting regions than in areas not corresponding to the connecting regions.

3. The image sensor according to claim 1, wherein the impurity concentration in the second partial region is lower in areas corresponding to the connecting regions than in areas not corresponding to the connecting regions.

4. The image sensor according to claim 1, wherein the plurality of connecting regions connect the pair of first regions and the pair of second regions in different combinations.

5. The image sensor according to claim 4, wherein the pixel array includes:
a first arrangement in which the direction of arranging the pair of first regions is the first direction and connected to the pair of second regions in a first combination via the plurality of connecting regions;
a second arrangement in which the direction of arranging the pair of first regions is the second direction and connected to the pair of second regions in the first combination via the plurality of connecting regions;
a third arrangement in which the direction of arranging the pair of first regions is the first direction and connected to the pair of second regions in a second combination which is different from the first combination via the plurality of connecting regions; and
a fourth arrangement in which the direction of arranging the pair of first regions is the second direction and connected to the pair of second regions in the second combination via the plurality of connecting regions.

6. The image sensor according to claim 5, wherein the first arrangement and the third arrangement are orientated such that one of each pair of the second regions including the second partial region which has the area corresponding to the connecting region is placed on the side closer to a center of the pixel array than the other of each pair of second regions.

7. The image sensor according to claim 1, wherein each conversion unit is connected to two pairs of the second regions via the transfer unit.

8. The image sensor according to claim 7, wherein combinations of the two pairs of second regions include a first combination in which the directions of arranging two pairs of the first regions corresponding to the two pairs of second regions are both in the first direction and a second combination in which the direction of arranging one of two pairs of the first regions corresponding to the two pairs of second regions is the first direction and the direction of arranging the other of the two pairs of the first regions is the second direction.

9. The image sensor according to claim 1, further comprising a Bayer color filter and provided between the microlenses and the pixel array,
wherein the pixel array is configured so that green color filters are arranged between the microlenses and the pair of first regions which are arranged in the first direction.

10. An image capturing apparatus comprising:
an image sensor comprising:
a plurality of microlenses; and
a pixel array having, with respect to each of the microlenses,
a pair of first regions formed at a first depth from a surface on which light is incident,
a pair of second regions formed at a second depth deeper than the first depth,
a plurality of connecting regions that connects the pair of first regions and the pair of second regions, respectively,
a conversion unit that converts charge into voltage, and
a transfer unit, which is connected to each of the second regions, that transfers the charge accumulated in the second regions to the conversion unit,
a focus detection unit that obtains pupil division signals respectively corresponding to divided pupil regions from signals output from the pixel array, and perform phase difference focus detection based on the pupil division signals,
wherein a direction of arranging the pair of second regions corresponding to each microlens is a first direction, and a direction of arranging the pair of first regions is either the first direction or a second direction which is orthogonal to the first direction,
wherein the first regions generate charge by performing photoelectric conversion on incident light, and the second regions accumulate the charge generated in the first regions via the connecting regions,
wherein a length of each of the second regions in the depth direction in a first partial region of the second regions is shorter than a length of the second region in the depth direction in a second partial region of the second region, or an impurity concentration in the first partial region is lower than an impurity concentration in the second partial region,
wherein the first partial region is located farther from the transfer unit than the second partial region, and
wherein the conversion unit, the conversion unit, and the focus detection unit are implemented by one or more processors, circuitry or a combination thereof.

11. The image capturing apparatus according to claim 10, wherein phase difference focus detection is performed by using signals output from a pixel group with each pixel having a second arrangement in which the direction of arranging the pair of first regions is the second direction and connected to the pair of second regions in a first combination via the plurality of connecting regions, and by using signals output from a pixel group with each pixel having a fourth arrangement in which the direction of arranging the pair of first regions is the second direction and connected to the pair of second regions in a second combination via the plurality of connecting regions.

12. The image capturing apparatus according to claim 11, wherein different conversion coefficients for calculating a defocus amount from an image shift amount of phase difference signals are used for the pixel group with each pixel having the second arrangement and for the pixel group with each pixel having the fourth arrangement.

13. An image sensor comprising:
a plurality of microlenses; and
a pixel array having, with respect to each of the microlenses,
a pair of first regions formed at a first depth from a surface on which light is incident,
a pair of second regions formed at a second depth deeper than the first depth, and
a plurality of connecting regions that connect the pair of first regions and the pair of second regions, respectively,
wherein a direction of arranging the pair of second regions corresponding to each microlens is a first direction, and a direction of arranging the pair of first regions is either the first direction or a second direction which is orthogonal to the first direction, and
wherein the plurality of connecting regions connect the pair of first regions and the pair of second regions in different combinations;
wherein the pixel array includes:
a first arrangement in which the direction of arranging the pair of first regions is the first direction and connected to the pair of second regions in a first combination via the plurality of connecting regions;
a second arrangement in which the direction of arranging the pair of first regions is the second direction and connected to the pair of second regions in the first combination via the plurality of connecting regions;
a third arrangement in which the direction of arranging the pair of first regions is the first direction and connected to the pair of second regions in a second combination which is different from the first combination via the plurality of connecting regions; and
a fourth arrangement in which the direction of arranging the pair of first regions is the second direction and connected to the pair of second regions in the second combination via the plurality of connecting regions.

14. The image sensor according to claim 13, wherein the first arrangement and the third arrangement are orientated such that one of each pair of the second regions including a second partial region which has an area corresponding to the connecting region is placed on the side closer to a center of the pixel array than the other of each pair of second regions.

15. The image sensor according to claim 13, wherein the pixel array further having, with respect to each of the microlens, a conversion unit that converts charges into voltage, and a transfer unit, which is connected to each of the second regions, that transfers the charge accumulated in the second regions to the conversion unit, wherein each conversion unit is connected to two pairs of the second regions via the transfer unit.

16. The image sensor according to claim 15, wherein combinations of the two pairs of second regions include a first combination in which the directions of arranging two pairs of the first regions corresponding to the two pairs of second regions are both in the first direction and a second combination in which the direction of arranging one of two pairs of the first regions corresponding to the two pairs of second regions is the first direction and the direction of arranging the other of the two pairs of the first regions is the second direction.

17. The image sensor according to claim 13, further comprising a Bayer color filter and provided between the microlenses and the pixel array, wherein the pixel array is configured so that green color filters are arranged between the microlenses and the pair of first regions which are arranged in the first direction.

\* \* \* \* \*